United States Patent
Campbell et al.

(10) Patent No.: US 8,274,790 B2
(45) Date of Patent: Sep. 25, 2012

(54) AUTOMATICALLY RECONFIGURABLE LIQUID-COOLING APPARATUS FOR AN ELECTRONICS RACK

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Randall G. Kemink, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 129 days.

(21) Appl. No.: 12/947,302

(22) Filed: Nov. 16, 2010

(65) Prior Publication Data

US 2012/0120603 A1 May 17, 2012

(51) Int. Cl.
*H05K 7/20* (2006.01)
*F28F 7/00* (2006.01)
*F28D 15/00* (2006.01)

(52) U.S. Cl. .......... 361/696; 165/80.4; 165/104.33; 361/699; 361/701

(58) Field of Classification Search .......... 361/696, 361/699, 701
See application file for complete search history.

(56) References Cited

U.S. PATENT DOCUMENTS

| | | |
|---|---|---|
| 3,754,596 A | 8/1973 | Ward, Jr. |
| 5,198,962 A | 3/1993 | Tyson |
| 5,752,011 A | 5/1998 | Thomas et al. |
| 5,974,557 A | 10/1999 | Thomas et al. |
| 6,349,391 B1 | 2/2002 | Petivan et al. |
| 6,374,627 B1 | 4/2002 | Schumacher et al. |
| 6,494,050 B2 | 12/2002 | Spinazzola et al. |
| 6,535,798 B1 | 3/2003 | Bhatia et al. |
| 6,587,343 B2 | 7/2003 | Novotny et al. |

(Continued)

FOREIGN PATENT DOCUMENTS

DE 19845821 B4 4/2000

OTHER PUBLICATIONS

Morgan, "IBM Hints at Triple Redundancy in Power6", (http://www.itjungle.com/breaking/bn032906-story-1.html) (Mar. 29, 2006).

(Continued)

*Primary Examiner* — Gregory Thompson
(74) *Attorney, Agent, or Firm* — Dennis Jung, Esq.; Kevin P. Radigan, Esq.; Heslin, Rothenberg, Farley & Mesiti P.C.

(57) ABSTRACT

An apparatus is provided for cooling an electronics rack, which includes an electronic subsystem across which air passing through the rack flows. A cooling unit provides, via system coolant supply and return manifolds, system coolant in parallel to the electronic subsystem and an air-to-liquid heat exchanger disposed to cool, in normal-mode, air passing through the rack. A controller monitors coolant associated with the cooling unit and automatically transitions the cooling apparatus from normal-mode to failure-mode responsive to detecting a failure of the coolant. In transitioning to failure-mode, multiple isolation valves are employed in switching to a serial flow of system coolant from the electronic subsystem to the heat exchanger for rejecting, via the system coolant, heat from the electronic subsystem to air passing across the heat exchanger.

20 Claims, 15 Drawing Sheets

U.S. PATENT DOCUMENTS

| | | |
|---|---|---|
| 6,763,880 B1 | 7/2004 | Shih |
| 6,807,056 B2 | 10/2004 | Kondo et al. |
| 6,819,563 B1 | 11/2004 | Chu et al. |
| 6,854,284 B2 | 2/2005 | Bash et al. |
| 6,854,287 B2 | 2/2005 | Patel et al. |
| 6,867,970 B2 | 3/2005 | Muller et al. |
| 6,896,612 B1 | 5/2005 | Novotny |
| 6,927,980 B2 | 8/2005 | Fukuda et al. |
| 6,968,709 B2 * | 11/2005 | Goth et al. .................... 62/259.2 |
| 6,973,801 B1 | 12/2005 | Campbell et al. |
| 6,997,006 B2 | 2/2006 | Kameyama et al. |
| 7,002,799 B2 | 2/2006 | Malone et al. |
| 7,011,143 B2 | 3/2006 | Corrado et al. |
| 7,086,247 B2 | 8/2006 | Campbell et al. |
| 7,106,590 B2 | 9/2006 | Chu et al. |
| 7,110,260 B2 | 9/2006 | Weber et al. |
| 7,219,247 B2 | 5/2007 | Law et al. |
| 7,236,363 B2 | 6/2007 | Belady |
| 7,315,448 B1 | 1/2008 | Bash et al. |
| 7,400,505 B2 | 7/2008 | Campbell et al. |
| 7,418,825 B1 * | 9/2008 | Bean, Jr. ..................... 62/259.2 |
| 7,436,666 B1 | 10/2008 | Konshak |
| 7,486,513 B2 | 2/2009 | Hall et al. |
| 7,534,167 B2 * | 5/2009 | Day ............................ 454/187 |
| 7,641,101 B2 | 1/2010 | Campbell et al. |
| 7,647,787 B2 | 1/2010 | Belady et al. |
| 7,757,506 B2 | 7/2010 | Ellsworth, Jr. et al. |
| 7,788,940 B2 | 9/2010 | Madara et al. |
| 7,867,070 B2 * | 1/2011 | Day ............................ 454/184 |
| 7,907,406 B1 * | 3/2011 | Campbell et al. ............ 361/699 |
| 7,944,694 B2 * | 5/2011 | Campbell et al. ............ 361/699 |
| 2004/0221604 A1 | 11/2004 | Ota et al. |
| 2005/0061541 A1 | 3/2005 | Belady |
| 2006/0002086 A1 | 1/2006 | Teneketges et al. |
| 2006/0065000 A1 | 3/2006 | Belady |
| 2007/0101334 A1 | 5/2007 | Atyam et al. |
| 2007/0119569 A1 | 5/2007 | Campbell et al. |
| 2007/0227710 A1 | 10/2007 | Belady et al. |
| 2009/0086428 A1 | 4/2009 | Campbell et al. |
| 2009/0086432 A1 | 4/2009 | Campbell et al. |
| 2009/0126909 A1 | 5/2009 | Ellsworth, Jr. et al. |
| 2010/0067193 A1 * | 3/2010 | Arimilli et al. .......... 361/679.47 |
| 2010/0236772 A1 * | 9/2010 | Novotny et al. .............. 165/287 |
| 2010/0263855 A1 | 10/2010 | Arimilli et al. |
| 2011/0075372 A1 * | 3/2011 | Zimbeck et al. .............. 361/700 |

OTHER PUBLICATIONS

Arent, "Liquid Coolant Distribution Unit with Convertible Air or Water Cooling", IBM Technical Disclosure Bulletin, IP Prior Art Database, IP.com No. IPCOM000044828D (Feb. 6, 2005).

Delia et al., "System Cooling Design for the Water-Cooled IBM Enterprise System/900 Processors", IBM Journal of Research and Development, vol. 36, No. 4, pp. 791-803 (Jul. 1992).

\* cited by examiner

AUTOMATICALLY RECONFIGURABLE LIQUID-COOLING APPARATUS FOR AN ELECTRONICS RACK

BACKGROUND

The present invention relates in general to apparatuses and methods for facilitating operation of liquid-cooled, rack-mounted assemblages of individual electronics units, such as rack-mounted computer server units.

The power dissipation of integrated circuit chips, and the modules containing the chips, continues to increase in order to achieve increases in processor performance. This trend poses a cooling challenge at both the module and system levels. Increased airflow rates are needed to effectively cool high power modules and to limit the temperature of the air that is exhausted into the computer center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer by providing greater airflow, through the use of a more powerful air moving device or by increasing the rotational speed (i.e., RPMs) of an existing air moving device. However, this approach is becoming problematic at the rack level in the context of a computer installation (i.e., data center).

The sensible heat load carried by the air exiting the rack is stressing the availability of the room air-conditioning to effectively handle the load. This is especially true for large installations with "server farms" or large banks of computer racks close together. In such installations, liquid cooling (e.g., water cooling) is an attractive technology to manage the higher heat fluxes. The liquid absorbs the heat dissipated by the components/modules in an efficient manner. Typically, the heat is ultimately transferred from the liquid to an outside environment, whether it be air or other liquid coolants.

BRIEF SUMMARY

In one aspect, the shortcomings of the prior art are overcome and additional advantages are provided through provision of a cooling apparatus for facilitating cooling of an electronics rack. The cooling apparatus includes: at least one cooling unit, an air-to-liquid heat exchanger, multiple isolation valves, and at least one controller. The at least one cooling unit is configured to provide, via a coolant loop, system coolant to the at least one electronic subsystem for facilitating cooling thereof, wherein each cooling unit comprises a liquid-to-liquid heat exchanger, a first coolant path and a second coolant path, the first coolant path of each cooling unit receiving, in normal operation, chilled coolant from a source and passing at least a portion thereof through the liquid-to-liquid heat exchanger, and the second coolant path being coupled in fluid communication with the coolant loop, and providing in normal operation, cooled system coolant to the at least one electronic subsystem, and expelling heat in the liquid-to-liquid heat exchanger from the system coolant to the chilled coolant in the first coolant path. The air-to-liquid heat exchanger is associated with the electronics rack for cooling, in normal operation, at least a portion of air passing through the electronics rack, the air-to-liquid heat exchanger being coupled to the coolant loop to receive system coolant therefrom and exhaust system coolant thereto. The multiple isolation valves are coupled to the coolant loop to facilitate transitioning of the cooling apparatus between a normal-mode, parallel flow of system coolant through the at least one electronic subsystem and the air-to-liquid heat exchanger and a failure-mode, serial flow of system coolant from the at least one electronic subsystem to the air-to-liquid heat exchanger. The at least one controller is coupled to the multiple isolation valves for automatically transitioning the cooling apparatus from the normal-mode, parallel flow of system coolant through the at least one electronic subsystem and the air-to-liquid heat exchanger to the failure-mode, serial flow of system coolant from the at least one electronic subsystem to the air-to-liquid heat exchanger responsive to a failure of the chilled coolant from the source. In normal-mode, the at least one cooling unit provides cooled system coolant in parallel to the at least one electronic subsystem, for liquid-cooling thereof, and to the air-to-liquid heat exchanger for cooling at least a portion of air passing through the electronics rack. Responsive to detection of a failure, the at least one controller employs the multiple isolation valves to automatically transition the cooling apparatus to the failure-mode, serial flow of system coolant from the at least one electronic subsystem to the air-to-liquid heat exchanger for rejecting, via the system coolant, heat from the at least one electronic subsystem to air passing across the air-to-liquid heat exchanger.

In another aspect, a cooled electronic system is provided which includes an electronics rack, comprising an air inlet side and an air outlet side respectively allowing ingress and egress of air through the rack, and a cooling apparatus for facilitating cooling of the electronics rack. The cooling apparatus includes: at least one cooling unit, an air-to-liquid heat exchanger, multiple isolation valves, and at least one controller. The at least one cooling unit is configured to provide, via a coolant loop, system coolant to the at least one electronic subsystem for facilitating cooling thereof, wherein each cooling unit comprises a liquid-to-liquid heat exchanger, a first coolant path and a second coolant path, the first coolant path of each cooling unit receiving, in normal operation, chilled coolant from a source and passing at least a portion thereof through the liquid-to-liquid heat exchanger, and the second coolant path being coupled in fluid communication with the coolant loop, and providing in normal operation, cooled system coolant to the at least one electronic subsystem, and expelling heat in the liquid-to-liquid heat exchanger from the system coolant to the chilled coolant in the first coolant path. The air-to-liquid heat exchanger is associated with the electronics rack for cooling, in normal operation, at least a portion of air passing through the electronics rack, the air-to-liquid heat exchanger being coupled to the coolant loop to receive system coolant therefrom and exhaust system coolant thereto. The multiple isolation valves are coupled to the coolant loop to facilitate selective transitioning of the cooling apparatus between normal-mode, parallel flow of system coolant through the at least one electronic subsystem and the air-to-liquid heat exchanger and a failure-mode, serial flow of system coolant from the at least one electronic subsystem to the air-to-liquid heat exchanger. The at least one controller is coupled to the multiple isolation valves for automatically transitioning the cooling apparatus from the normal-mode, parallel flow of system coolant through the at least one electronic subsystem and the air-to-liquid heat exchanger to the failure-mode, serial flow of system coolant from the at least one electronic subsystem to the air-to-liquid heat exchanger responsive to a failure of the chilled coolant from the source.

In normal-mode, the at least one cooling unit provides cooled system coolant in parallel to the at least one electronic subsystem, for liquid-cooling thereof, and to the air-to-liquid heat exchanger for cooling at least a portion of air passing through the electronics rack. Responsive to detection of a failure, the at least one controller employs the multiple isolation valves to automatically transition the cooling apparatus to the failure-mode, serial flow of system coolant from the at least one electronic subsystem to the air-to-liquid heat exchanger for rejecting, via the system coolant, heat from the at least one electronic subsystem to air passing across the air-to-liquid heat exchanger.

In a further aspect, a method of facilitating cooling of an electronic component is provided. The method includes: employing at least one cooling unit configured to provide, via a coolant loop, system coolant to at least one electronic subsystem of the electronics rack for facilitating cooling thereof, wherein each cooling unit comprises a liquid-to-liquid heat exchanger, a first coolant path and a second coolant path, the first coolant path of each cooling unit receiving, in normal operation, chilled coolant from a source and passing at least a portion thereof through the liquid-to-liquid heat exchanger, and the second coolant path being coupled in fluid communication with the coolant loop, and providing in normal operation, cooled system coolant to the at least one electronic subsystem, and expelling heat in the liquid-to-liquid heat exchanger from the system coolant to the chilled coolant in the first coolant path; utilizing an air-to-liquid heat exchanger associated with the electronics rack for cooling, in normal operation, at least a portion of air passing through the electronics rack, the air-to-liquid heat exchanger being coupled to the coolant loop to receive system coolant therefrom and exhaust system coolant thereto; and employing multiple isolation valves coupled to the coolant loop to facilitate automatic transitioning of the cooling apparatus by at least one controller thereof, from normal-mode, parallel flow of system coolant through the at least one electronic subsystem and the air-to-liquid heat exchanger to failure-mode, serial flow of system coolant from the at least one electronic subsystem to the air-to-liquid heat exchanger responsive to a failure of the chilled coolant from the source, wherein in normal-mode, the at least one cooling unit provides cooled system coolant in parallel to the at least one electronic subsystem, for liquid-cooling thereof, and the air-to-liquid heat exchanger for cooling at least a portion of air passing through the electronics rack, and responsive to detection of the failure, the at least one controller employs the multiple isolation valves to automatically transition the cooling apparatus to the failure-mode, serial flow of system coolant from the at least one electronic subsystem to the air-to-liquid heat exchanger for rejecting, via the system coolant, heat from the at least one electronic subsystem to air passing across the air-to-liquid heat exchanger.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
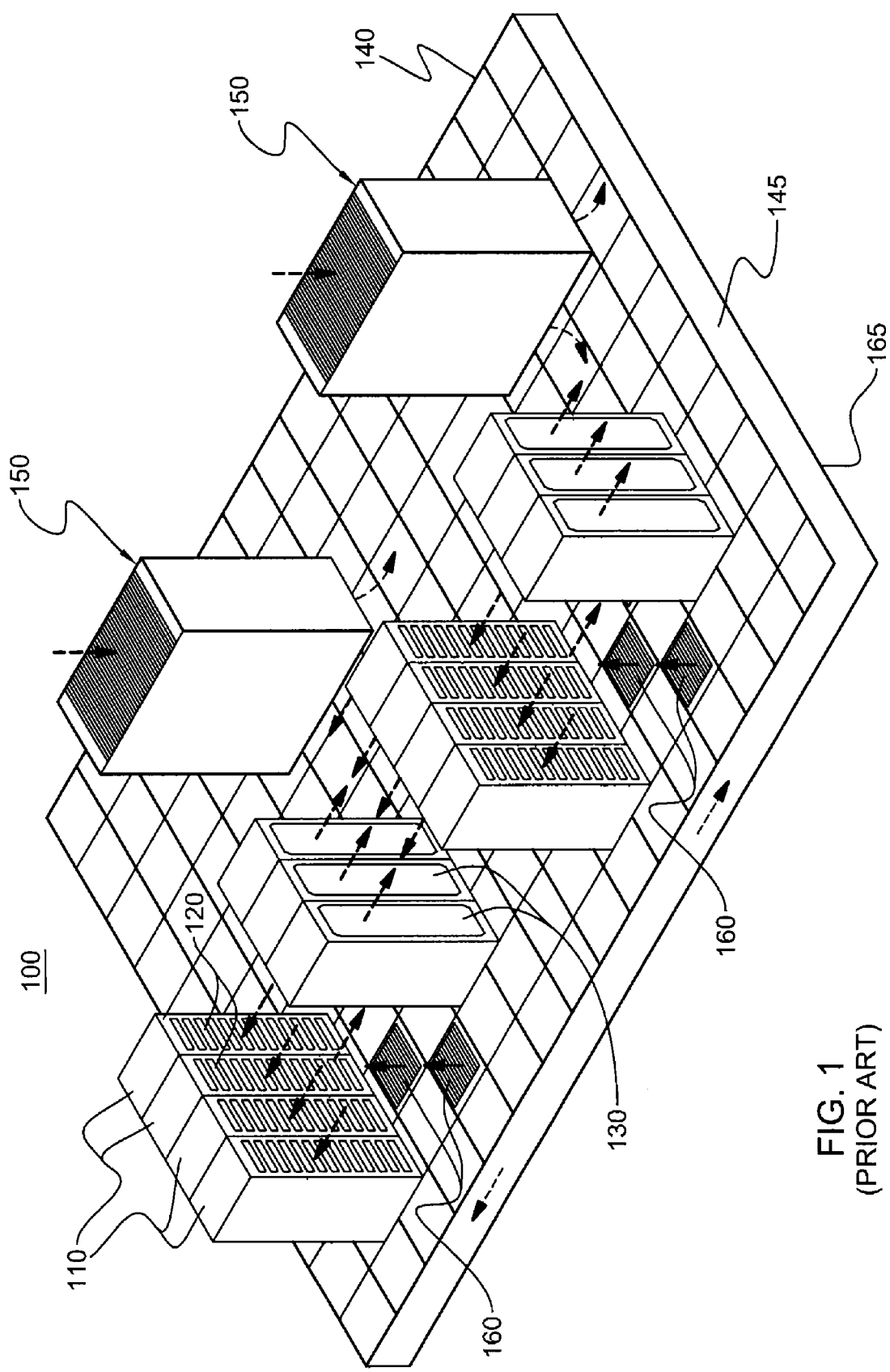
FIG. 1 depicts one embodiment of a conventional raised floor layout of an air-cooled computer installation.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronic system, and may be, for example, a stand alone computer processor having high, mid or low end processing capability. In one embodiment, an electronics rack may comprise multiple electronic subsystems, each having one or more heat generating components disposed therein requiring cooling. "Electronic subsystem" refers to any sub-housing, blade, book, drawer, node, compartment, etc., having one or more heat generating electronic components disposed therein. Each electronic subsystem of an electronics rack may be movable or fixed relative to the electronics rack, with the rack-mounted electronic drawers of a multi-drawer rack unit and blades of a blade center system being two examples of subsystems of an electronics rack to be cooled.

"Electronic component" refers to any heat generating electronic component of, for example, a computer system or other electronics unit requiring cooling. By way of example, an electronic component may comprise one or more integrated circuit dies and/or other electronic devices to be cooled, including one or more processor dies, memory dies and memory support dies. As a further example, the electronic component may comprise one or more bare dies or one or more packaged dies disposed on a common carrier. As used herein, "primary heat generating component" refers to a primary heat generating electronic component within an electronic subsystem, while "secondary heat generating component" refers to an electronic component of the electronic subsystem generating less heat than the primary heat generating component to be cooled. "Primary heat generating die" refers, for example, to a primary heat generating die or chip within a heat generating electronic component comprising primary and secondary heat generating dies (with a processor die being one example). "Secondary heat generating die" refers to a die of a multi-die electronic component generating less heat than the primary heat generating die thereof (with memory dies and memory support dies being examples of secondary dies to be cooled). As one example, a heat generating electronic component could comprise multiple primary heat generating bare dies and multiple secondary heat generating dies on a common carrier. Further, unless otherwise specified herein, the term "liquid-cooled cold plate" refers to any conventional thermally conductive structure having a plurality of channels or passageways formed therein for flowing of liquid coolant therethrough. In addition, "metallurgically bonded" refers generally herein to two components being welded, brazed or soldered together by any means.

As used herein, "air-to-liquid heat exchanger" means any heat exchange mechanism characterized as described herein through which liquid coolant can circulate; and includes, one or more discrete air-to-liquid heat exchangers coupled either in series or in parallel. An air-to-liquid heat exchanger may comprise, for example, one or more coolant flow paths, formed of thermally conductive tubing (such as copper or other tubing) in thermal or mechanical contact with a plurality of air-cooled cooling fins. Size, configuration and construction of the air-to-liquid heat exchanger vary without departing from the scope of the invention disclosed herein. A "liquid-to-liquid heat exchanger" may comprise, for example, two or more coolant flow paths, formed of thermally conductive tubing (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, one or more of the coolants may comprise a brine, a fluorocarbon liquid, a liquid metal, or other similar coolant, or refrigerant, while still maintaining the advantages and unique features of the present invention.

Reference is made below to the drawings, which are not drawn to scale for reasons of understanding, wherein the same reference numbers used throughout different figures designate the same or similar components.

As shown in FIG. 1, in a raised floor layout of an air cooled computer installation 100 typical in the prior art, multiple electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have an air moving device (e.g., fan or blower) to provide forced inlet-to-outlet air flow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more conditioned air units 150, also disposed within the computer installation 100. Room air is taken into each conditioned air unit 150 near an upper portion thereof. This room air comprises in part exhausted air from the "hot" aisles of the computer installation defined by opposing air outlet sides 130 of the electronics racks 110.

Figure 2:
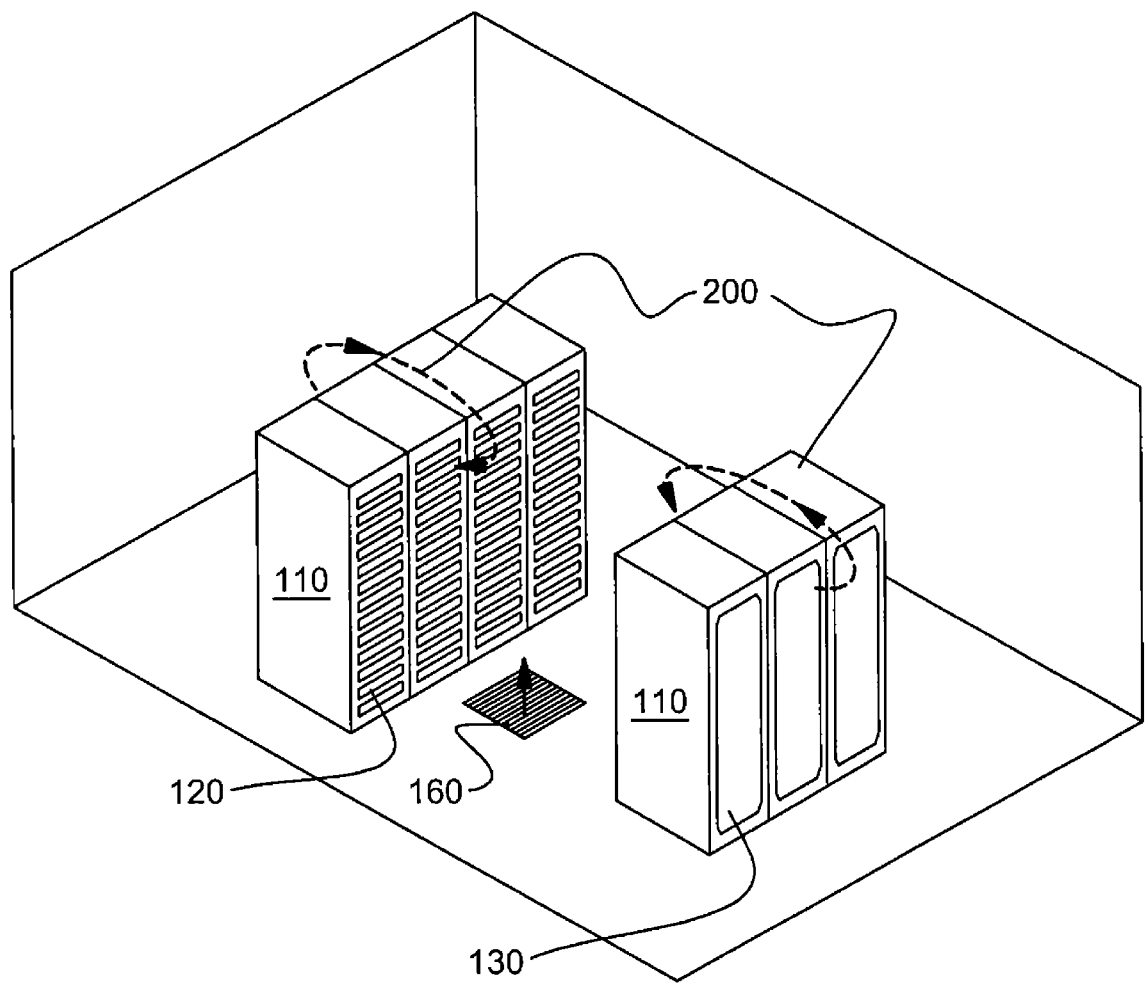
FIG. 2 depicts one problem addressed by the present invention, showing recirculation airflow patterns in one implementation of a raised floor layout of an air-cooled computer installation, in accordance with an aspect of the present invention.

Due to the ever increasing air flow requirements through electronics racks, and limits of air distribution within the typical computer room installation, recirculation problems within the room may occur. This is shown in FIG. 2 for a raised floor layout, wherein hot air recirculation 200 occurs from the air outlet sides 130 of the electronics racks back to the cold air aisle defined by the opposing air inlet sides 120 of the electronics racks. This recirculation can occur because the conditioned air supplied through tiles 160 is typically only a fraction of the air flow rate forced through the electronics racks by the air moving devices disposed therein. This can be due, for example, to limitations on the tile sizes (or diffuser flow rates). The remaining fraction of the supply of inlet side air is often made up by ambient room air through recirculation

200. This re-circulating flow is often very complex in nature, and can lead to significantly higher rack unit inlet temperatures than might be expected.

The recirculation of hot exhaust air from the hot aisle of the computer room installation to the cold aisle can be detrimental to the performance and reliability of the computer system(s) or electronic system(s) within the racks. Data center equipment is typically designed to operate with rack air inlet temperatures in the 18-35° C. range. For a raised floor layout such as depicted in FIG. 1, however, temperatures can range from 15-20° C. at the lower portion of the rack, close to the cooled air input floor vents, to as much as 45-50° C. at the upper portion of the electronics rack, where the hot air can form a self-sustaining recirculation loop. Since the allowable rack heat load is limited by the rack inlet air temperature at the "hot" part, this temperature distribution correlates to a lower processing capacity. Also, computer installation equipment almost always represents a high capital investment to the customer. Thus, it is of significant importance, from a product reliability and performance view point, and from a customer satisfaction and business perspective, to maintain the temperature of the inlet air uniform. The efficient cooling of such computer and electronic systems, and the amelioration of localized hot air inlet temperatures to one or more rack units due to recirculation of air currents, are addressed by the apparatuses and methods disclosed herein.

Figure 3:
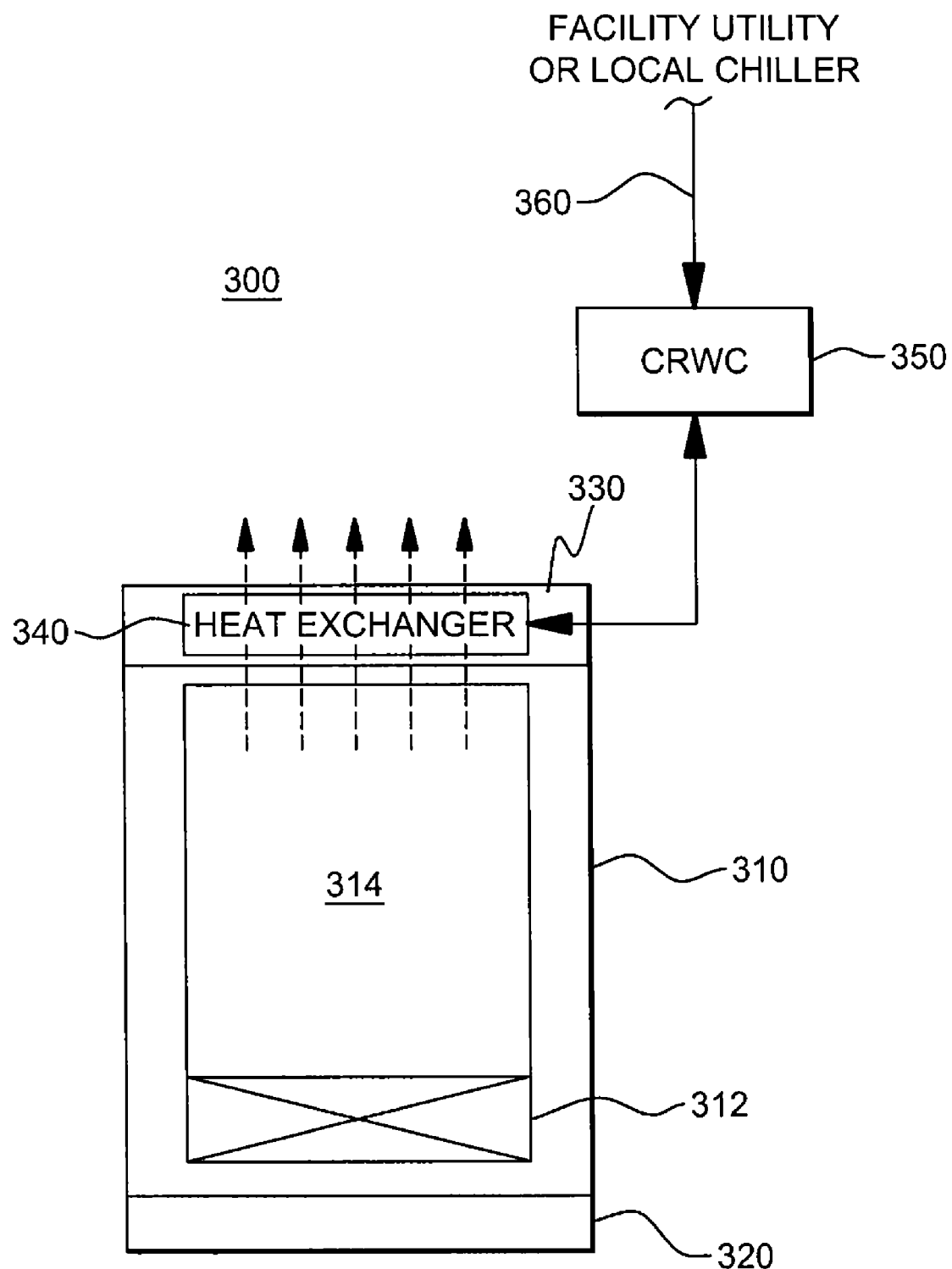
FIG. 3 is a cross-sectional plan view of one embodiment of an electronics rack utilizing at least one air-to-liquid heat exchanger disposed at the air outlet side of the electronics rack, in accordance with an aspect of the present invention.

FIG. 3 depicts one embodiment of a cooled electronic system, generally denoted 300, in accordance with an aspect of the present invention. In this embodiment, electronic system 300 includes an electronics rack 310 having an inlet door cover 320 and an outlet door cover 330 which have openings to allow for the ingress and egress of external air from the inlet side to the outlet side of the electronics rack 310. The system further includes at least one air moving device 312 for moving external air across at least one electronic drawer unit 314 positioned within the electronics rack. Disposed within outlet door cover 330 is a heat exchange assembly 340. Heat exchange assembly 340 includes an air-to-liquid heat exchanger through which the inlet-to-outlet air flow through the electronics rack passes. A computer room water conditioner (CRWC) 350 is used to buffer heat exchange assembly 340 from the building utility or local chiller coolant 360, which is provided as input to CRWC 350. The CRWC 350 provides system water or system coolant to heat exchange assembly 340. Heat exchange assembly 340 removes heat from the exhausted inlet-to-outlet air flow through the electronics rack for transfer via the system water or coolant to CRWC 350. Advantageously, providing a heat exchange assembly with an air-to-liquid heat exchanger such as disclosed herein at the outlet door cover of one or more electronics racks in a computer installation can, in normal operation, significantly reduce heat loads on existing air conditioning units within the computer installation, and facilitate the cooling of the rack-mounted electronics units.

Figure 4:
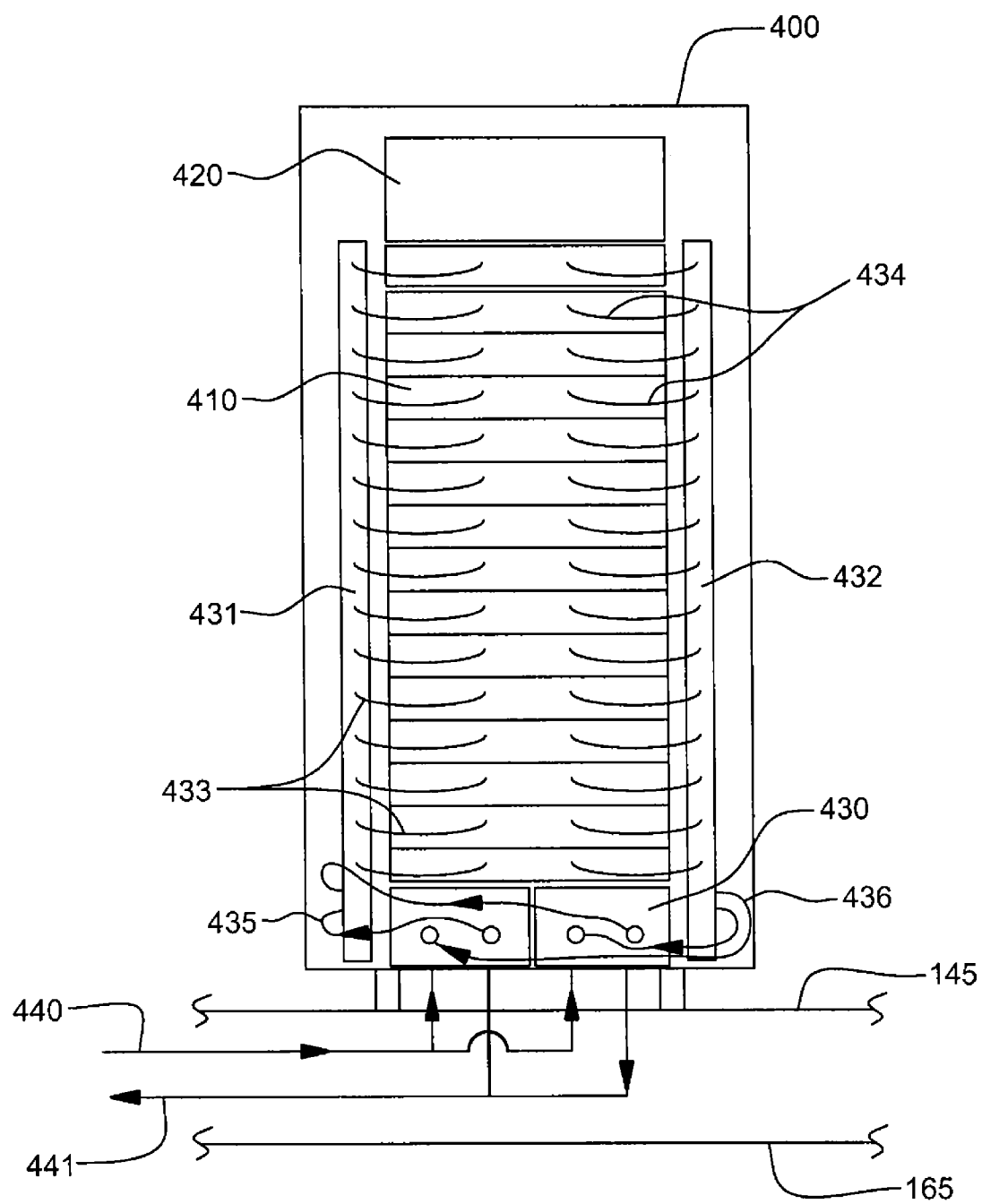
FIG. 4 is a front elevational view of one embodiment of a liquid-cooled electronics rack comprising multiple electronic subsystems cooled by an apparatus, in accordance with an aspect of the present invention.

FIG. 4 depicts one embodiment of a liquid-cooled electronics rack 400 which employs a cooling apparatus to be monitored and operated as described herein. In one embodiment, liquid-cooled electronics rack 400 comprises a plurality of electronic subsystems 410, which are (in one embodiment) processor or server nodes. A bulk power regulator 420 is shown disposed at an upper portion of liquid-cooled electronics rack 400, and two modular cooling units (MCUs) 430 are disposed in a lower portion of the liquid-cooled electronics rack. In the embodiments described herein, the coolant is assumed to be water or an aqueous-based solution, again, by way of example only.

In addition to MCUs 430, the cooling apparatus includes a system water supply manifold 431, a system water return manifold 432, and manifold-to-node fluid connect hoses 433 coupling system water supply manifold 431 to electronic subsystems 410, and node-to-manifold fluid connect hoses 434 coupling the individual electronic subsystems 410 to system water return manifold 432. Each MCU 430 is in fluid communication with system water supply manifold 431 via a respective system water supply hose 435, and each MCU 430 is in fluid communication with system water return manifold 432 via a respective system water return hose 436.

As illustrated, heat load of the electronic subsystems is transferred from the system water to cooler facility water supplied by facility water supply line 440 and facility water return line 441 disposed, in the illustrated embodiment, in the space between a raised floor 145 and a base floor 165.

Figure 5:
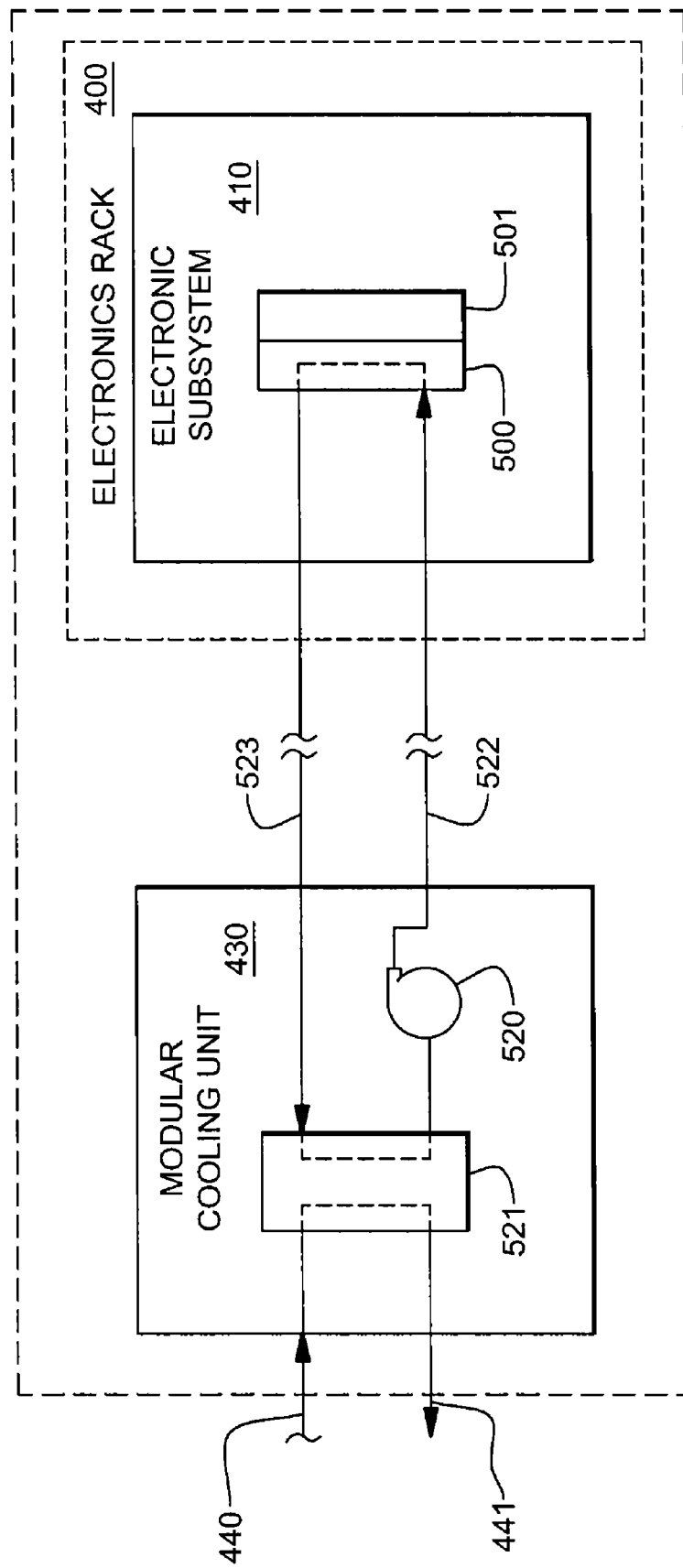
FIG. 5 is a schematic of one embodiment of an electronic subsystem of an electronics rack, wherein an electronic module is liquid-cooled by system coolant provided by one or more modular cooling units disposed within the electronics rack, in accordance with an aspect of the present invention.

FIG. 5 schematically illustrates operation of the cooling apparatus of FIG. 4, wherein a liquid-cooled cold plate 500 is shown coupled to an electronic module 501 of an electronic subsystem 410 within the liquid-cooled electronics rack 400. Heat is removed from electronic module 501 via the system coolant circulated via pump 520 through cold plate 500 within the system coolant loop defined by liquid-to-liquid heat exchanger 521 of modular cooling unit 430, lines 522, 523 and cold plate 500. The system coolant loop and modular cooling unit are designed to provide coolant of a controlled temperature and pressure, as well as controlled chemistry and cleanliness to cool the electronic module(s). Furthermore, the system coolant is physically separate from the less controlled facility coolant in lines 440, 441, to which heat is ultimately transferred.

Figure 6:
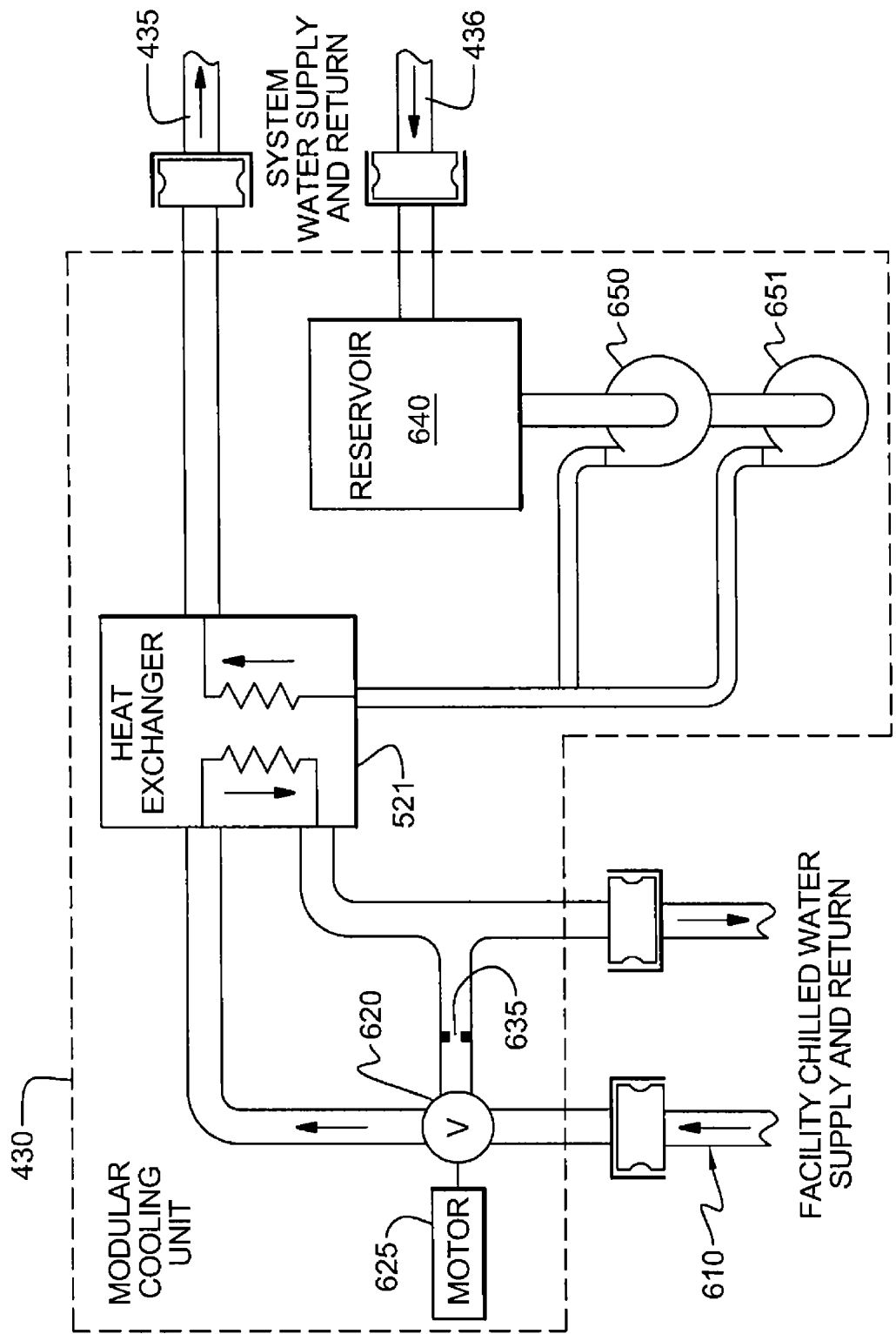
FIG. 6 is a schematic of one embodiment of a modular cooling unit disposed within a liquid-cooled electronics rack, in accordance with an aspect of the present invention.

FIG. 6 depicts a more detailed embodiment of a modular cooling unit 430, in accordance with an aspect of the present invention. As shown in FIG. 6, modular cooling unit 430 includes a first cooling loop wherein building chilled, facility coolant is supplied 610 and passes through a control valve 620 driven by a motor 625. Valve 620 determines an amount of facility coolant to be passed through heat exchanger 521, with a portion of the facility coolant possibly being returned directly via a bypass orifice 635. The modular water cooling unit further includes a second cooling loop with a reservoir tank 640 from which system coolant is pumped, either by pump 650 or pump 651, into the heat exchanger 521 for conditioning and output thereof, as cooled system coolant to the electronics rack to be cooled. The cooled system coolant is supplied to the system water supply manifold and system water return manifold of the liquid-cooled electronics rack via the system water supply hose 435 and system water return hose 436, respectively.

Figure 7:
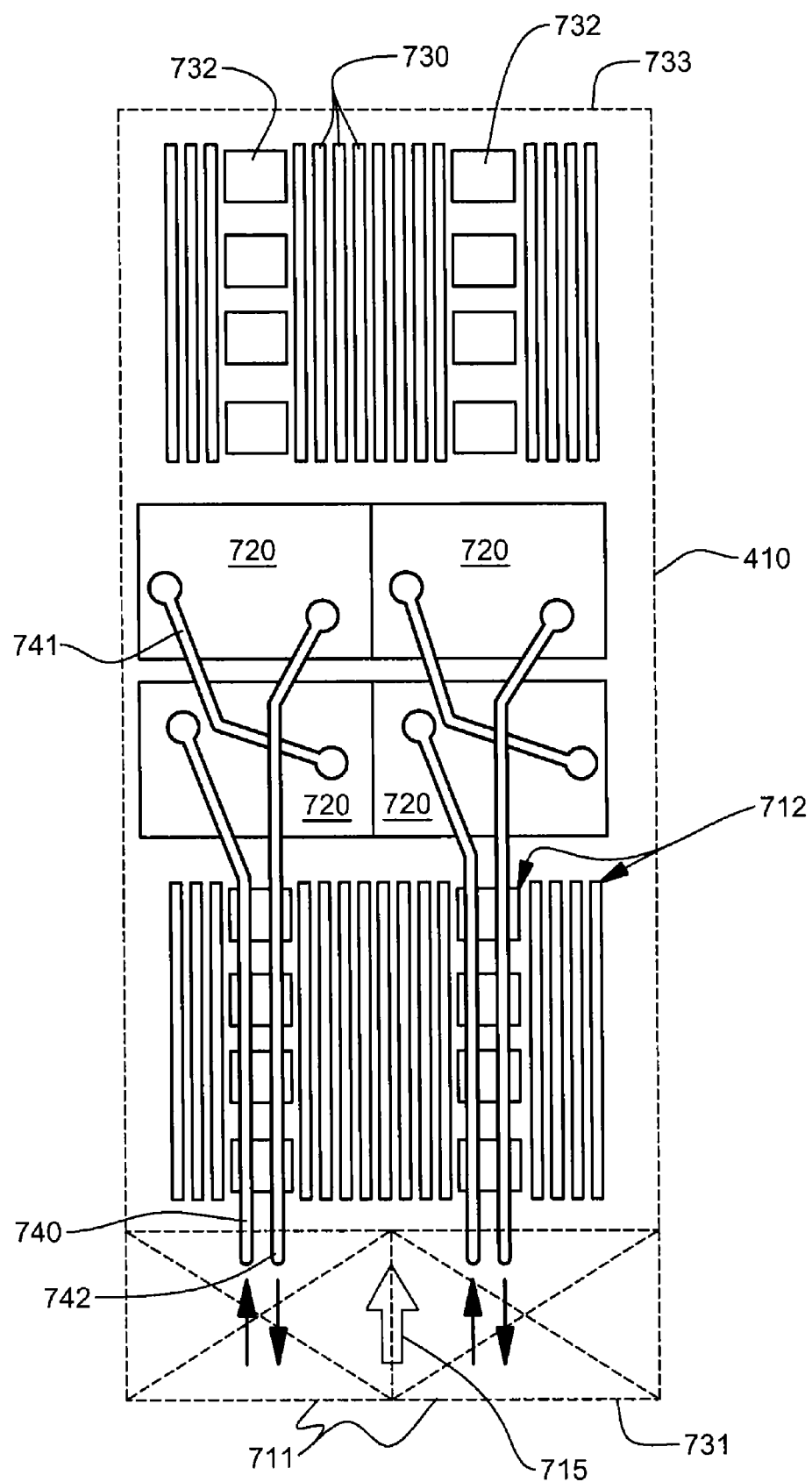
FIG. 7 is a plan view of one embodiment of an electronic subsystem layout illustrating an air and liquid cooling subsystem for cooling components of the electronic subsystem, in accordance with an aspect of the present invention.

FIG. 7 depicts one embodiment of an electronic subsystem 410 component layout wherein one or more air moving devices 711 provide forced air flow 715 to cool multiple components 712 within electronic subsystem 713. Cool air is taken in through a front 731 and exhausted out a back 733 of the drawer. The multiple components to be cooled include multiple processor modules to which liquid-cooled cold plates 720 (of a liquid-based cooling system) are coupled, as well as multiple arrays of memory modules 730 (e.g., dual in-line memory modules (DIMMs)) and multiple rows of memory support modules 732 (e.g., DIMM control modules) to which air-cooled heat sinks are coupled. In the embodiment illustrated, memory modules 730 and the memory support modules 732 are partially arrayed near front 731 of electronic subsystem 410, and partially arrayed near back 733 of electronic subsystem 410. Also, in the embodiment of FIG.

7, memory modules 730 and the memory support modules 732 are cooled by air flow 715 across the electronic subsystem.

The illustrated liquid-based cooling system further includes multiple coolant-carrying tubes connected to and in fluid communication with liquid-cooled cold plates 720. The coolant-carrying tubes comprise sets of coolant-carrying tubes, with each set including (for example) a coolant supply tube 740, a bridge tube 741 and a coolant return tube 742. In this example, each set of tubes provides liquid coolant to a series-connected pair of cold plates 720 (coupled to a pair of processor modules). Coolant flows into a first cold plate of each pair via the coolant supply tube 740 and from the first cold plate to a second cold plate of the pair via bridge tube or line 741, which may or may not be thermally conductive. From the second cold plate of the pair, coolant is returned through the respective coolant return tube 742.

Figure 8:
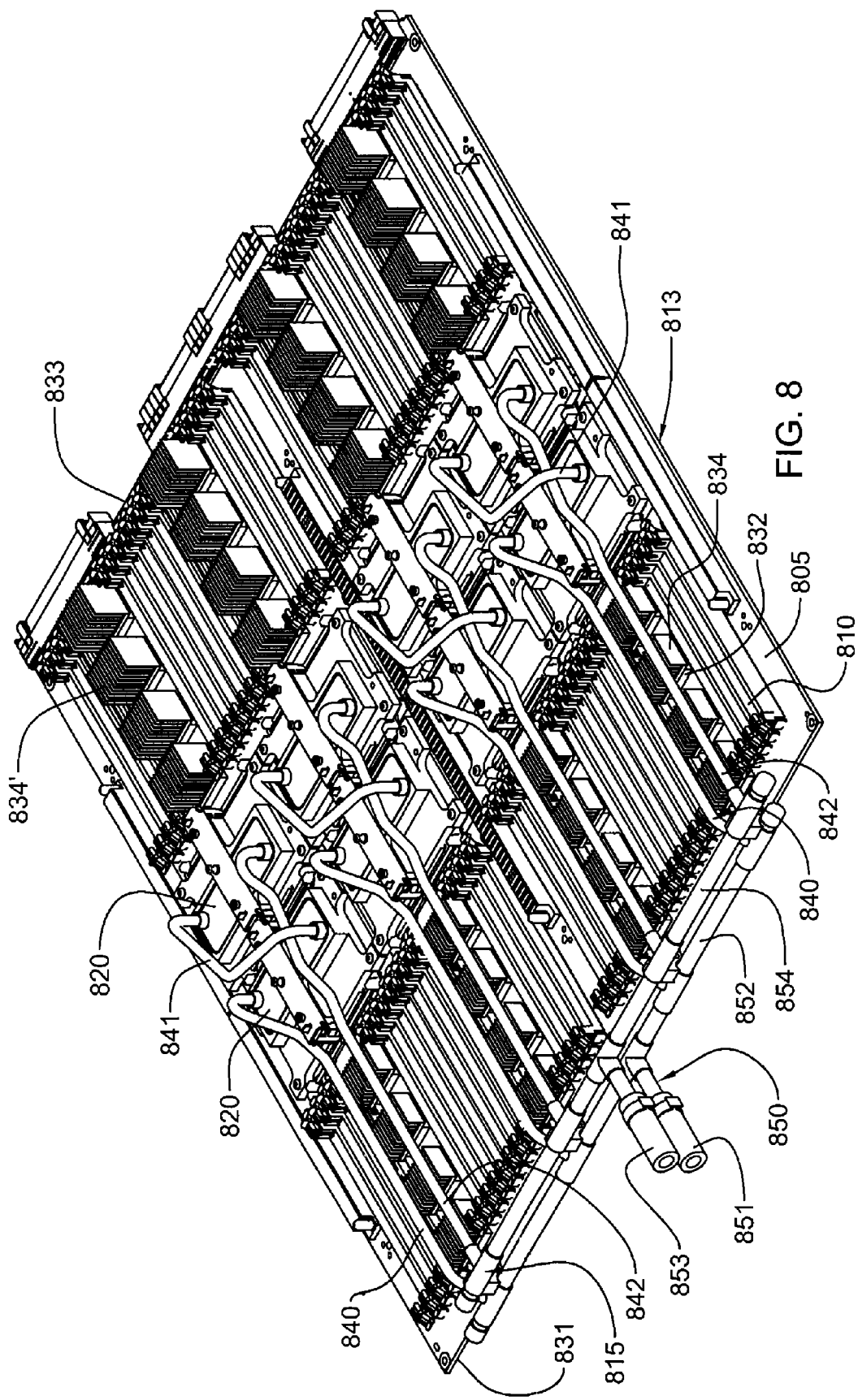
FIG. 8 depicts one detailed embodiment of a partially-assembled electronic subsystem layout, wherein the electronic subsystem includes eight heat-generating electronic components to be actively cooled, each having a respective liquid-cooled cold plate of a liquid-based cooling system coupled thereto, in accordance with an aspect of the present invention.

FIG. 8 depicts in greater detail an alternate electronics drawer layout comprising eight processor modules, each having a respective liquid-cooled cold plate of a liquid-based cooling system coupled thereto. The liquid-based cooling system is shown to further include associated coolant-carrying tubes for facilitating passage of liquid coolant through the liquid-cooled cold plates and a header subassembly to facilitate distribution of liquid coolant to and return of liquid coolant from the liquid-cooled cold plates. By way of specific example, the liquid coolant passing through the liquid-based cooling subsystem is chilled water.

As noted, various liquid coolants significantly outperform air in the task of removing heat from heat generating electronic components of an electronic system, and thereby more effectively maintain the components at a desirable temperature for enhanced reliability and peak performance. As liquid-based cooling systems are designed and deployed, it is advantageous to architect systems which maximize reliability and minimize the potential for leaks while meeting all other mechanical, electrical and chemical requirements of a given electronics system implementation. These more robust cooling systems have unique problems in their assembly and implementation. For example, one assembly solution is to utilize multiple fittings within the electronic system, and use flexible plastic or rubber tubing to connect headers, cold plates, pumps and other components. However, such a solution may not meet a given customer's specifications and need for reliability.

Thus, presented herein in one aspect (and by way of example only) is a robust and reliable liquid-based cooling system specially preconfigured and prefabricated as a monolithic structure for positioning within a particular electronics drawer.

FIG. 8 is an isometric view of one embodiment of an electronic drawer and monolithic cooling system, in accordance with an aspect of the present invention. The depicted planar server assembly includes a multi-layer printed circuit board to which memory DIMM sockets and various electronic components to be cooled are attached both physically and electrically. In the cooling system depicted, a supply header is provided to distribute liquid coolant from a single inlet to multiple parallel coolant flow paths and a return header collects exhausted coolant from the multiple parallel coolant flow paths into a single outlet. Each parallel coolant flow path includes one or more cold plates in series flow arrangement to cool one or more electronic components to which the cold plates are mechanically and thermally coupled. The number of parallel paths and the number of series-connected liquid-cooled cold plates depends, for example on the desired device temperature, available coolant temperature and coolant flow rate, and the total heat load being dissipated from each electronic component.

More particularly, FIG. 8 depicts a partially assembled electronic system 813 and an assembled liquid-based cooling system 815 coupled to primary heat generating components (e.g., including processor dies) to be cooled. In this embodiment, the electronic system is configured for (or as) an electronic drawer of an electronics rack, and includes, by way of example, a support substrate or planar board 805, a plurality of memory module sockets 810 (with the memory modules (e.g., dual in-line memory modules) not shown), multiple rows of memory support modules 832 (each having coupled thereto an air-cooled heat sink 834), and multiple processor modules (not shown) disposed below the liquid-cooled cold plates 820 of the liquid-based cooling system 815.

In addition to liquid-cooled cold plates 820, liquid-based cooling system 815 includes multiple coolant-carrying tubes, including coolant supply tubes 840 and coolant return tubes 842 in fluid communication with respective liquid-cooled cold plates 820. The coolant-carrying tubes 840, 842 are also connected to a header (or manifold) subassembly 850 which facilitates distribution of liquid coolant to the coolant supply tubes and return of liquid coolant from the coolant return tubes 842. In this embodiment, the air-cooled heat sinks 834 coupled to memory support modules 832 closer to front 831 of electronic drawer 813 are shorter in height than the air-cooled heat sinks 834' coupled to memory support modules 832 near back 833 of electronics drawer 813. This size difference is to accommodate the coolant-carrying tubes 840, 842 since, in this embodiment, the header subassembly 850 is at the front 831 of the electronic drawer and the multiple liquid-cooled cold plates 820 are in the middle of the drawer.

Liquid-based cooling system 815 comprises (in this embodiment) a preconfigured monolithic structure which includes multiple (pre-assembled) liquid-cooled cold plates 820 configured and disposed in spaced relation to engage respective heat generating electronic components. Each liquid-cooled cold plate 820 includes, in this embodiment, a liquid coolant inlet and a liquid coolant outlet, as well as an attachment subassembly (i.e., a cold plate/load arm assembly). Each attachment subassembly is employed to couple its respective liquid-cooled cold plate 820 to the associated electronic component to form the cold plate and electronic component assemblies. Alignment openings (i.e., thru-holes) are provided on the sides of the cold plate to receive alignment pins or positioning dowels during the assembly process. Additionally, connectors (or guide pins) are included within attachment subassembly which facilitate use of the attachment assembly.

As shown in FIG. 8, header subassembly 850 includes two liquid manifolds, i.e., a coolant supply header 852 and a coolant return header 854, which in one embodiment, are coupled together via supporting brackets. In the monolithic cooling structure of FIG. 8, the coolant supply header 852 is metallurgically bonded and in fluid communication to each coolant supply tube 840, while the coolant return header 854 is metallurgically bonded and in fluid communication to each coolant return tube 852. A single coolant inlet 851 and a single coolant outlet 853 extend from the header subassembly for coupling to the electronics rack's coolant supply and return manifolds (not shown).

FIG. 8 also depicts one embodiment of the preconfigured, coolant-carrying tubes. In addition to coolant supply tubes 840 and coolant return tubes 842, bridge tubes or lines 841 are provided for coupling, for example, a liquid coolant outlet of one liquid-cooled cold plate to the liquid coolant inlet of another liquid-cooled cold plate to connect in series fluid flow the cold plates, with the pair of cold plates receiving and returning liquid coolant via a respective set of coolant supply and return tubes. In one embodiment, the coolant supply tubes 840, bridge tubes 841 and coolant return tubes 842 are each preconfigured, semi-rigid tubes formed of a thermally conductive material, such as copper or aluminum, and the tubes are respectively brazed, soldered or welded in a fluid-tight manner to the header subassembly and/or the liquid-cooled cold plates. The tubes are preconfigured for a particular electronic system to facilitate installation of the monolithic structure in engaging relation with the electronic system.

Liquid cooling of heat-generating electronic components within an electronics rack can greatly facilitate removal of heat generated by those components. However, in certain high performance systems, the heat dissipated by certain components being liquid-cooled, such as processors, may exceed the ability of the liquid cooling system to extract heat. For example, a fully configured liquid-cooled electronics rack, such as described hereinabove may dissipate approximately 72 kW of heat. Half of this heat may be removed by liquid coolant using liquid-cooled cold plates such as described above. The other half of the heat may be dissipated by memory, power supplies, etc., which are air-cooled. Given the density at which electronics racks are placed on a data center floor, existing air-conditioning facilities are stressed with such a high air heat load from the electronics rack. Thus, a solution presented herein is to incorporate an air-to-liquid heat exchanger, for example, at the air outlet side of the electronics rack, to extract heat from air egressing from the electronics rack. This solution is presented herein in combination with liquid-cooled cold plate cooling of certain primary heat-generating components within the electronics rack. To provide the necessary amount of coolant, two MCUs are (in one embodiment) associated with the electronics rack, and system coolant is fed from each MCU to the air-to-liquid heat exchanger in parallel to the flow of system coolant to the liquid-cooled cold plates disposed within the one or more electronic subsystems of the electronics rack.

Also, for a high availability system, techniques are described hereinbelow for maintaining operation of one modular cooling unit, notwithstanding failure of another modular cooling unit of an electronics rack. This allows continued provision of system coolant to the one or more electronic subsystems of the rack being liquid-cooled. To facilitate liquid cooling of the primary heat-generating electronics components within the electronics rack, one or more isolation valves are employed, in one embodiment upon detection of failure at one MCU of the two MCUs, to shut off coolant flow to the air-to-liquid heat exchanger, and thereby, conserve coolant for the direct cooling of the electronic subsystems.

The above-summarized aspects of the invention are described further below with reference to the embodiment of FIG. 9.

Figure 9:
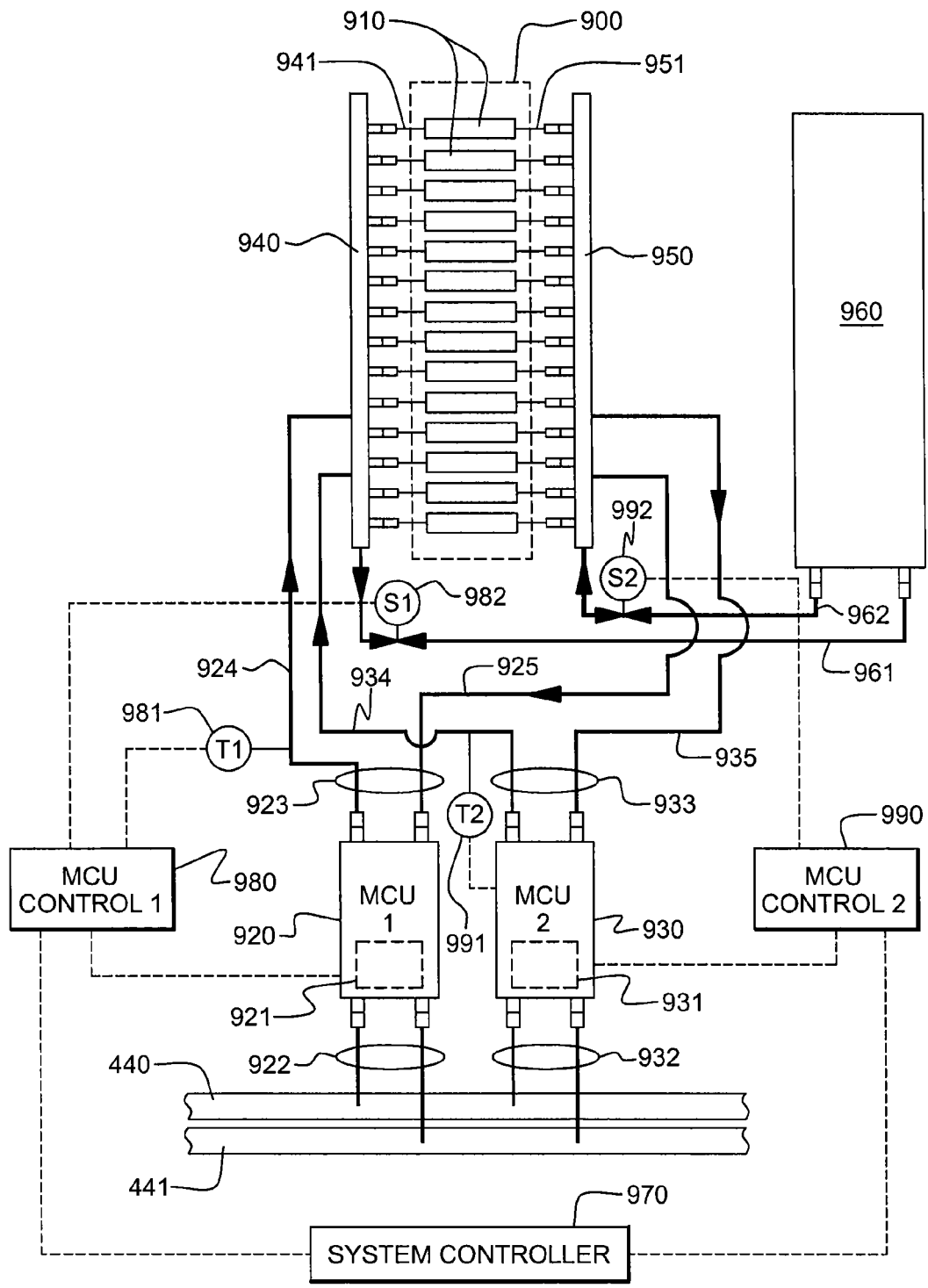
FIG. 9 is a schematic of one embodiment of a cooled electronic system comprising a liquid-cooled electronics rack and a cooling apparatus associated therewith, wherein the cooling apparatus includes two modular cooling units (MCUs) for providing in parallel liquid coolant to the electronic subsystems of the rack, and an air-to-liquid heat exchanger disposed, for example, at an air outlet side of the electronics rack for cooling air egressing therefrom, in accordance with an aspect of the present invention.

FIG. 9 illustrates one embodiment of a system wherein an electronics rack 900 includes a plurality of heat-generating electronic subsystems 910, which are liquid-cooled employing a cooling apparatus comprising at least two modular cooling units (MCUs) 920, 930 labeled MCU 1 & MCU 2, respectively. The MCUs are configured and coupled to provide system coolant in parallel to the plurality of heat-generating electronic subsystems for facilitating liquid cooling thereof. Each MCU 920, 930 includes a liquid-to-liquid heat exchanger 921, 931, coupled to a first coolant loop 922, 932, and to a second coolant loop, 923, 933, respectively. The first coolant loops 922, 932 are coupled to receive chilled coolant, such as facility coolant, via (for example) facility water supply line 440 and facility water return line 441. Each first coolant loop 922, 932 passes at least a portion of the chilled coolant flowing therein through the respective liquid-to-liquid heat exchanger 921, 931. Each second coolant loop 923, 933 provides cooled system coolant to the plurality of heat-generating electronic subsystems 910 of electronics rack 900, and expels heat via the respective liquid-to-liquid heat exchanger 921, 931 from the plurality of heat-generating electronic subsystems 910 to the chilled coolant in the first coolant loop 922, 932.

The second coolant loops 923, 933 include respective coolant supply lines 924, 934, which supply cooled system coolant from the liquid-to-liquid heat exchangers 921, 931 to a system coolant supply manifold 940. System coolant supply manifold 940 is coupled via flexible supply hoses 941 to the plurality of heat-generating electronic subsystems 910 of electronics rack 900 (e.g., using quick connect couplings connected to respective ports of the system coolant supply manifold). Similarly, second coolant loops 923, 933 include system coolant return lines 925, 935 coupling a system coolant return manifold 950 to the respective liquid-to-liquid heat exchangers 921, 931. System coolant is exhausted from the plurality of heat-generating electronic subsystems 910 via flexible return hoses 951 coupling the heat-generating electronic subsystems to system coolant return manifold 950. In one embodiment, the return hoses may couple to respective ports of the system coolant return manifold via quick connect couplings. Further, in one embodiment, the plurality of heat-generating electronic subsystems each include a respective liquid-based cooling subsystem, such as described above in connection with FIGS. 7 & 8, coupled to flexible supply hoses 941 and flexible return hoses 951 to facilitate liquid cooling of one or more heat-generating electronic components disposed within the electronic subsystem.

In addition to supplying and exhausting system coolant in parallel to the plurality of heat-generating electronic subsystems of the electronics rack, the MCUs 920, 930 also provide in parallel system coolant to an air-to-liquid heat exchanger 960 disposed, for example, for cooling air passing through the electronics rack from an air inlet side to an air outlet side thereof. By way of example, air-to-liquid heat exchanger 960 is a rear door heat exchanger disposed at the air outlet side of electronics rack 900. Further, in one example, air-to-liquid heat exchanger 960 is sized to cool substantially all air egressing from electronics rack 900, and thereby reduce air-conditioning requirements for a data center containing the electronics rack. In one example, a plurality of electronics racks in the data center are each provided with a cooling apparatus such as described herein and depicted in FIG. 9.

In the embodiment of FIG. 9, system coolant flows to and from air-to-liquid heat exchanger 960 via a coolant supply line 961 coupling system coolant supply manifold 940 to air-to-liquid heat exchanger 960, and a coolant return line 962 coupling the air-to-liquid heat exchanger to system coolant return manifold 950. Quick connect couplings may be employed at the inlet and outlet of air-to-liquid heat exchanger 960 and/or at corresponding ports at the system coolant supply and return manifolds to facilitate connection of coolant supply and return lines 961, 962. In one embodiment, it is assumed that one MCU of the two MCUs illustrated is incapable of being sized to function within required design parameters as a primary MCU (with the other MCU being a backup MCU) to extract the full heat load from both the plurality of heat-generating electronic subsystems and the air-to-liquid heat exchanger. Therefore, the two MCUs 920, 930 are assumed in normal operation to be functioning in parallel. This also ensures a measure of redundancy to the cooling system.

As shown, the cooling system further includes a system controller 970, and an MCU control 1 980 and an MCU control 2 990, which cooperate together to monitor system coolant temperature of each MCU, and automatically isolate air-to-liquid heat exchanger 960 upon detection of failure of one MCU (as well as to ensure shut down of a failing MCU) so as not to degrade cooling capability of the system coolant provided by the remaining operational MCU to the electronics subsystems of the rack. In one embodiment, the MCU control 1 and the MCU control 2 are control cards, each associated with a respective MCU.

As shown, system controller 970 is coupled to both MCU control 1 and the MCU control 2. MCU control 1 980 is coupled to a temperature sensor T1 981, which is disposed to sense system coolant temperature within system coolant supply line 924, for example, near a coolant outlet of liquid-to-liquid heat exchanger 921 within MCU 1 920. Additionally, MCU control 1 980 is coupled to a solenoid-actuated isolation valve S1 982, which in the embodiment depicted, is disposed within coolant supply line 961 coupling in fluid communication system coolant supply manifold 940 to air-to-liquid heat exchanger 960. Similarly, MCU control 2 990 couples to MCU 2 930, as well as to a second temperature sensor T2 991, disposed for sensing system coolant temperature within system coolant supply line 934, and to a second isolation valve S2 992, which in the example depicted, is coupled to coolant return line 962 coupling air-to-liquid heat exchanger 960 to system coolant return manifold 950.

Also note that in the example of FIG. 9, the MCUs operate to transfer heat extracted by the circulating system coolant to the facility chilled coolant. Note also that system coolant flow to the electronic subsystems and the air-to-liquid heat exchanger is in parallel. This flow arrangement advantageously provides a lowest temperature coolant to all of the cooling components in the system. This in turn translates into lowest possible electronic component temperatures within the electronic subsystems, as well as a maximum amount of heat removal from air flowing through the electronics rack by the air-to-liquid heat exchanger, for example, to allow a substantial amount of the heat to be removed prior to returning the air to the computer room environment.

Figure 10:
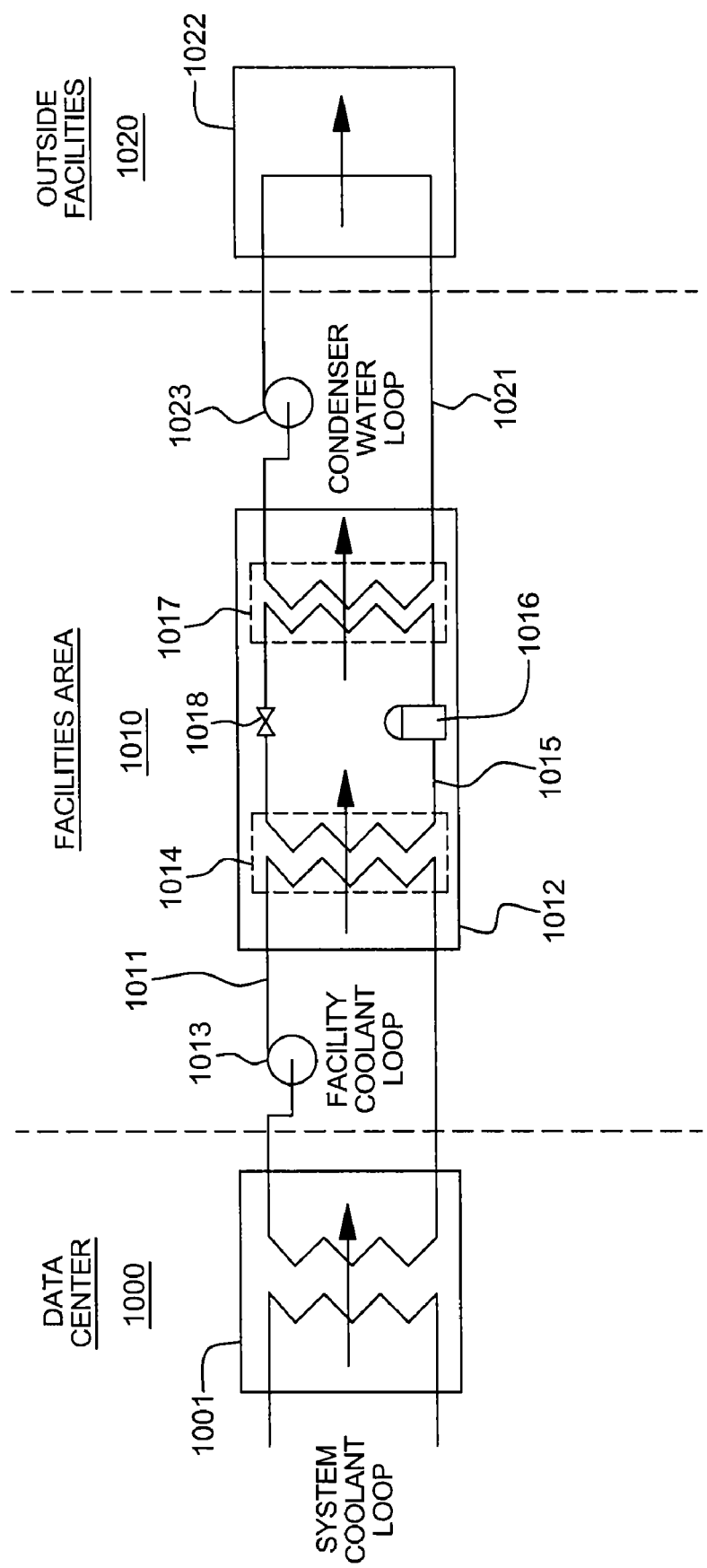
FIG. 10 is a schematic of one embodiment of heat transfer from one or more MCUs disposed within one or more electronics racks of a data center to a cooling tower disposed outside of the data center, in accordance with an aspect of the present invention.

FIG. 10 is a high-level illustration of one embodiment of heat transfer through a data center cooling system comprising liquid-cooled electronics racks such as described herein. In this embodiment, heat is transferred from one or more electronics racks within a data center 1000 to a facilities area 1010, and ultimately to an area 1020 outside of the facilities area and the data center. Specifically, one or more cooling units, such as modular cooling units (MCUs) 1001, each comprise a liquid-to-liquid heat exchanger for facilitating transfer of heat from system coolant flowing through the associated liquid-cooled electronics rack to a facility coolant loop 1011 disposed (in this embodiment) to transfer heat between MCU 1001 and a refrigeration chiller 1012. A coolant pump 1013 pumps facility coolant through facility coolant loop 1011 to facilitate transfer of heat from the liquid-to-liquid heat exchanger within MCU 1001 to an evaporator 1014 within refrigeration chiller 1012. Evaporator 1014 extracts heat from facility coolant flowing through facility coolant loop 1011 and transfers the heat to a refrigerant flowing through a refrigerant loop 1015. Refrigerant loop 1015 couples in fluid communication evaporator 1014, a compressor 1016, a condenser 1017 and an expansion valve 1018. Refrigeration chiller 1012 implements, in one embodiment, a conventional vapor-compression refrigeration cycle. Condenser 1017 dissipates heat to, for example, a condenser water loop 1021 disposed between refrigeration chiller 1012 and a cooling tower 1022 positioned, for example, outside 1020 facility area 1010 and data center 1000. Vaporized water is condensed within cooling tower 1022 and the condensate is re-circulated via a condensate water pump 1023 through condenser 1017 of refrigeration chiller 1012.

Thus, the overall cooling system transfers heat from the IT equipment, i.e., the electronics rack, to the outdoor ambient air. Moving in the direction of heat flow, heat generated within the electronics rack is transferred to the facility coolant loop via the modular cooling unit(s). The facility coolant loop carries the heat to a refrigeration chiller, with the heat being taken into the refrigeration chiller at its evaporator and rejected to a condenser water loop at its condenser. The condenser water passes outside of the facility to, for example, one or more cooling towers that transfer the heat to the outside ambient air. There are numerous events that could occur which could lead to either the loss of facility coolant cooling within facility coolant loop 1011, or the loss of facility coolant flow within facility coolant loop 1011. The former could result, for example, if the refrigeration chiller goes off-line, but the facility coolant pump continues to pump facility coolant through facility coolant loop 1011, while the later might result from losing operation of the facility coolant pump 1013. Either event could lead to an over-temperature condition within the one or more liquid-cooled electronics racks within the data center being serviced by the refrigeration chiller, possibly resulting in shutting down one or more of the electronics racks.

Disclosed herein with reference to FIGS. 11A-13 is one embodiment of a reconfigurable cooling apparatus which allows continued operation of the electronic subsystems of an electronics rack, notwithstanding loss of facility coolant cooling or loss of facility coolant flow. In the event of loss of facility coolant cooling or flow, heat extracted by system coolant flowing through the liquid-cooled electronic subsystems is rejected to the data center room air via the air-to-liquid heat exchanger. In this mode, temperature of the system coolant will rise until an equilibrium is reached where the amount of heat transferred to the room air equals the amount of heat extracted from the electronic subsystems. Should the air-to-liquid heat exchanger be coupled in parallel with the electronic subsystems, as depicted for example in FIG. 9, the equilibrium temperature of the fluid at the electronic subsystems being cooled would be higher than it would be if the air-to-liquid heat exchanger was coupled in series with the electronic subsystems (described below with reference to FIG. 11B). That is, in optimal, normal-mode operation, the air-to-liquid heat exchanger is coupled in parallel with the liquid-cooled electronic subsystems, while in failure-mode operation (e.g., due to a loss of facility coolant cooling or facility coolant flow), it is optimal for the air-to-liquid heat exchanger to be coupled in series fluid communication with the outlets of the liquid-cooled electronic subsystems. Therefore, disclosed hereinbelow is a cooling apparatus, including a valve and piping arrangement, together with control processes, that automatically adjusts flow of system coolant through the cooling apparatus between normal-mode, parallel flow of system coolant through the electronic subsystems and the air-to-liquid heat exchanger, and a failure-mode, serial flow of system coolant from the electronic subsystems to the air-to-liquid heat exchanger.

Figure 11A:
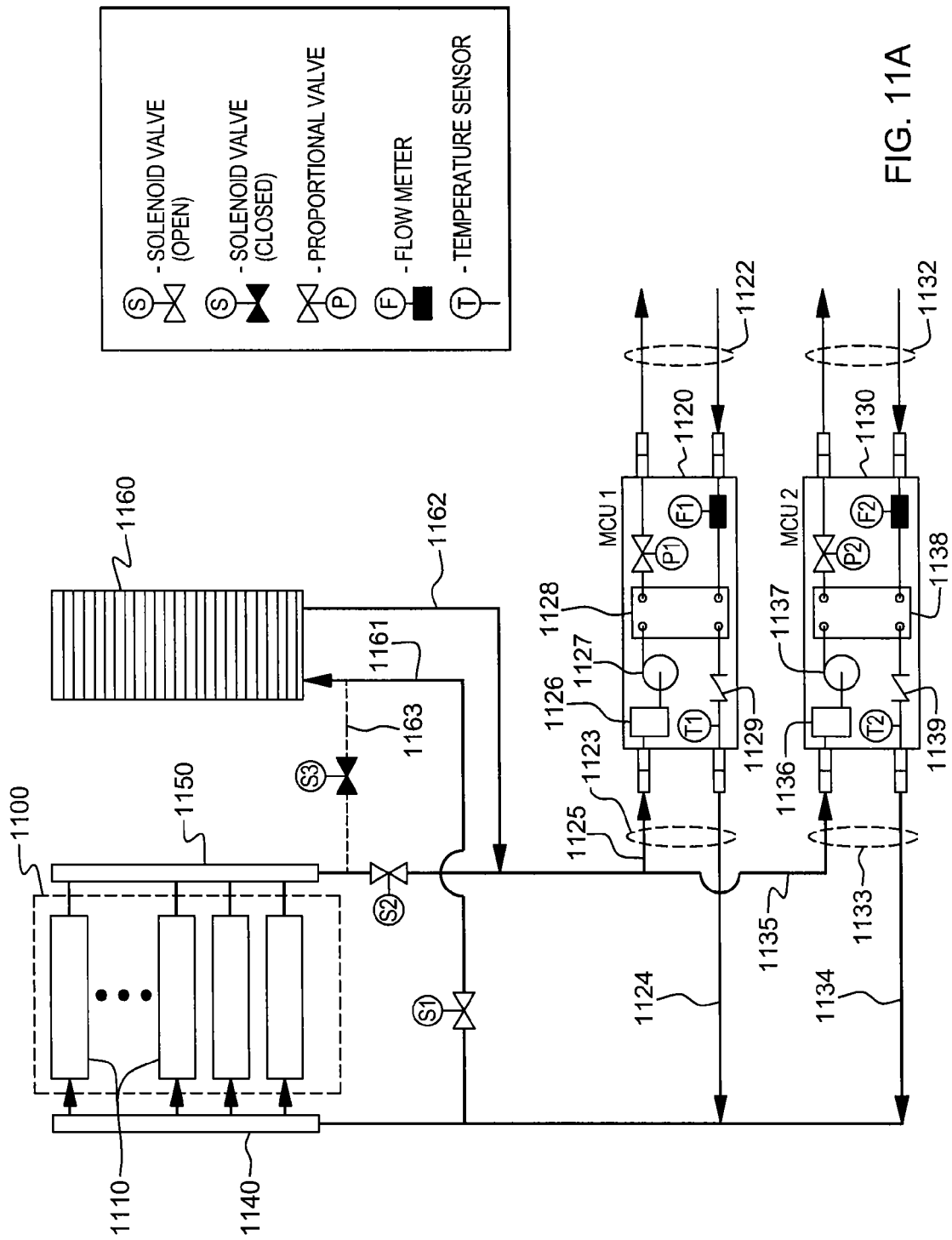
FIG. 11A is a schematic of an alternate embodiment of a cooled electronic system comprising an electronics rack and a cooling apparatus associated therewith shown in normal-mode, wherein system coolant flows in parallel through the electronic subsystems and the air-to-liquid heat exchanger, in accordance with an aspect of the present invention.
Figure 11B:
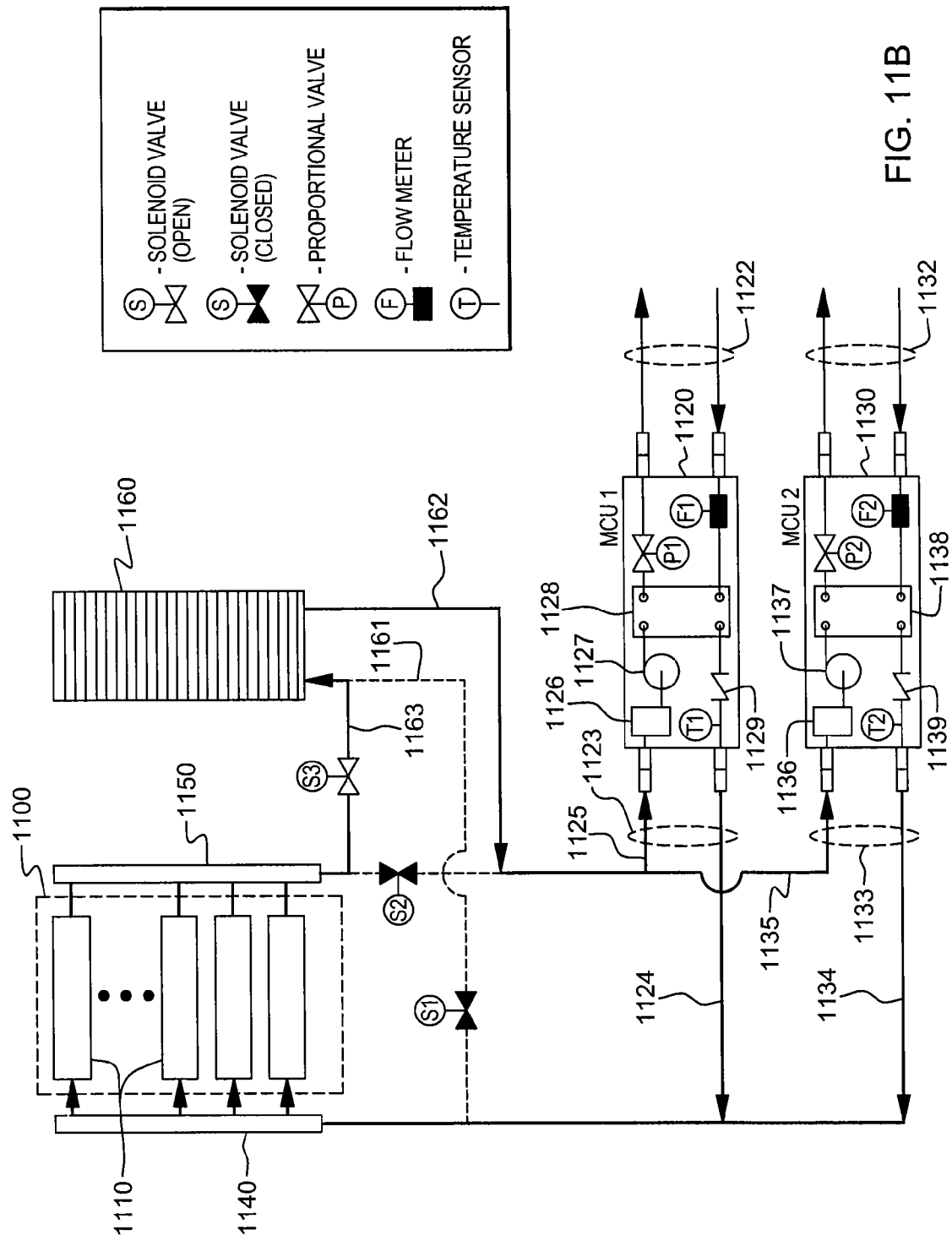
FIG. 11B is a schematic of the cooled electronic system of FIG. 11A, shown in failure-mode, wherein the multiple isolation valves are transitioned to establish serial flow of system coolant from the electronic subsystems to the air-to-liquid heat exchanger, in accordance with an aspect of the present invention.

FIGS. 11A & 11B respectively depict normal-mode and failure-mode operation of one embodiment of such a cooling apparatus. This cooling apparatus embodiment has certain changes to the piping and isolation valves (as described below) compared with the embodiment of FIG. 9.

In the embodiment of FIGS. 11A & 11B, a cooled electronic system is provided comprising an electronics rack 1100 including a plurality of heat-generating electronic subsystems 1110, which are liquid-cooled employing a cooling apparatus comprising, in the embodiment depicted, two modular cooling units (MCUs) 1120, 1130, labeled MCU 1 & MCU 2, respectively. Note that in this example, although described with reference to two MCUs, the cooling apparatus could be implemented using a single MCU sized to function within the required normal-mode design parameters for cooling the plurality of heat-generating electronic subsystems and the air-to-liquid heat exchanger. In the dual MCU embodiment depicted in FIGS. 11A & 11B, the two MCUs illustrated may operate as a primary MCU, and a backup MCU, or may operate in parallel (e.g., in the case where neither MCU can extract the full heat load from the plurality of heat-generating electronic subsystems and the air-to-liquid heat exchanger).

The MCUs are configured and coupled to provide system coolant in parallel to the plurality of heat-generating electronic subsystems for facilitating liquid-cooling thereof. Each MCU 1120, 1130 includes a liquid-to-liquid heat exchanger 1128, 1138, coupled to a facility coolant loop 1122, 1132 and to a system coolant loop 1123, 1133, respectively. Each MCU further includes a reservoir tank 1126, 1136, a system coolant pump 1127, 1137, and a check valve 1129, 1139, respectively. The facility coolant loops 1122, 1132 are coupled to receive chilled coolant, such as facility coolant, via (for example) a facility coolant supply line and a facility coolant return line (not shown). Each facility coolant loop 1122, 1132 includes a proportional valve P1, P2 for passing at least a portion of the chilled facility coolant flowing therein through the respective liquid-to-liquid heat exchangers 1128, 1138.

Each system coolant loop 1123, 1133 provides cooled system coolant to the plurality of heat-generating electronic subsystems 1110 of electronics rack 1100, and expels heat via the respective liquid-to-liquid heat exchanger 1128, 1138 from the plurality of heat-generating electronic subsystems 1110 to the chilled facility coolant in the facility coolant loop 1122, 1132, respectively. The system coolant loops 1123, 1133 include respective coolant supply lines 1124, 1134, which supply cooled system coolant from the liquid-to-liquid heat exchangers 1128, 1138 to a system coolant supply manifold 1140. System coolant supply manifold 1140 is coupled via, for example, flexible supply hoses, to the plurality of heat-generating electronic subsystems 1110 of electronics rack 1100 (e.g., using quick connect couplings coupled to respective ports of the system coolant supply manifold). Similarly, system coolant loops 1123, 1133 include system coolant return lines 1125, 1135 coupling a system coolant return manifold 1150 to the respective liquid-to-liquid heat exchangers 1128, 1138. System coolant is exhausted from the plurality of heat-generating electronic subsystems 1110 via flexible return hoses coupling the heat-generating electronic subsystems to the system coolant return manifold 1150. In one embodiment, the return hoses may couple to respective ports of the system coolant return manifold via quick connect couplings. Further, in one embodiment, the plurality of heat-generating electronic subsystems 1110 each include a respective liquid-based cooling subsystem, such as described above in connection with FIGS. 7 & 8 coupled to facilitate liquid-cooling of one or more heat-generating electronic components disposed within the electronic subsystem.

In addition to supplying the system coolant in parallel to the plurality of heat-generating electronic subsystems of the electronics rack, the MCUs 1120, 1130 also provide in parallel thereto (i.e., in normal-mode operation) coolant to an air-to-liquid heat exchanger 1160 disposed, for example, for cooling air passing through the electronics rack from an air inlet side to an air outlet side thereof. By way of example, air-to-liquid heat exchanger 1160 is a rear door heat exchanger disposed at the air outlet side of electronics rack 1100. Further, in one example, air-to-liquid heat exchanger 1160 is sized to at least partially cool all air egressing from electronics rack 1100, and thereby reduce air-conditioning requirements for a data center containing the electronics rack. In one example, a plurality of electronics racks in the data center are each provided with a cooling apparatus, such as described herein and depicted in FIGS. 11A & 11B.

Figure 12:
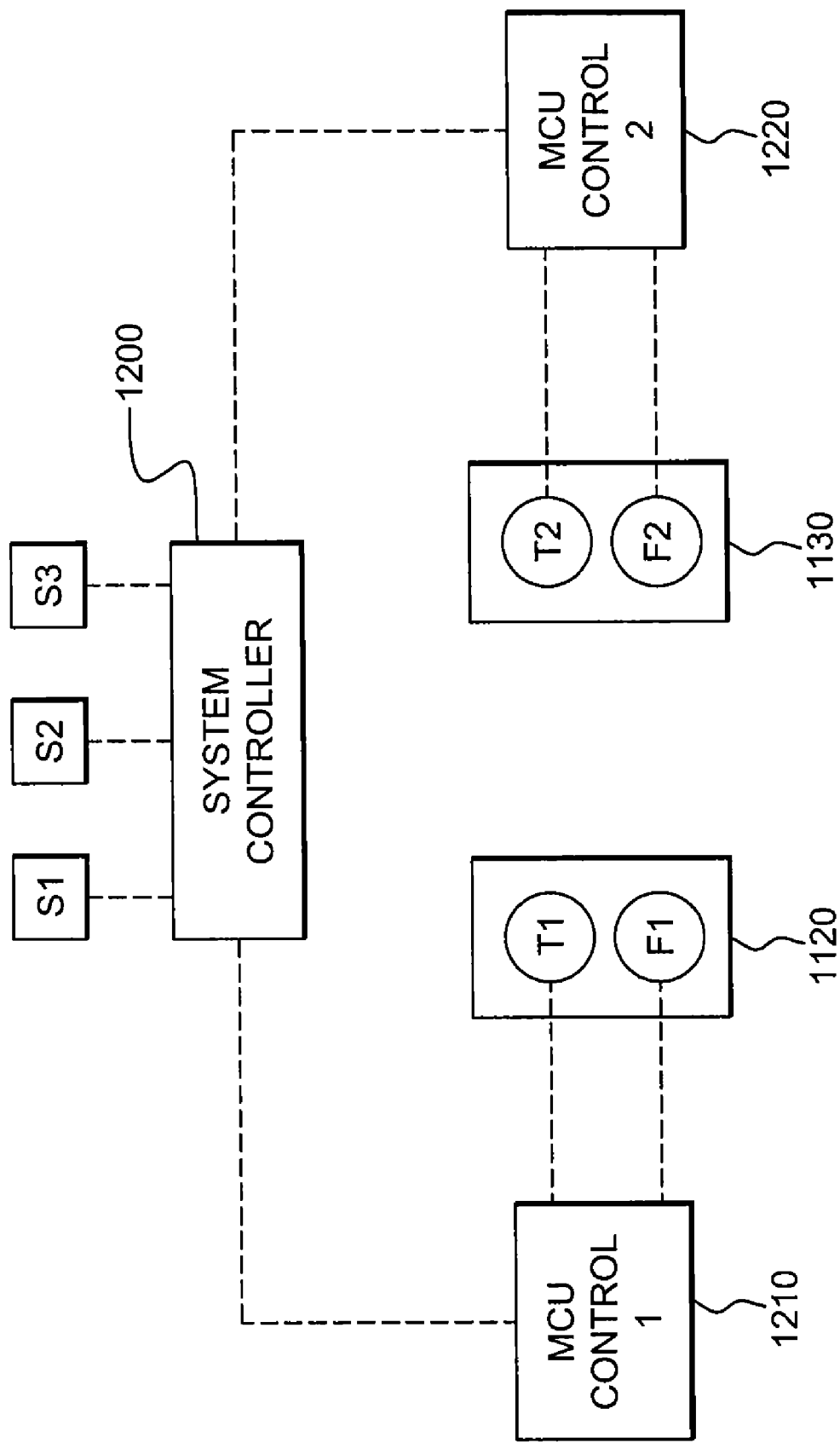
FIG. 12 is a schematic of one embodiment of a control arrangement for controlling two MCUs of a cooling apparatus such as depicted in FIGS. 11A & 11B, in accordance with an aspect of the present invention.

One embodiment of a control arrangement for the cooling apparatus of FIGS. 11A & 11B is depicted in FIG. 12. In this embodiment, the cooling apparatus further includes a system controller 1200, and an MCU control 1 1210 and an MCU control 2 1220, which (in one embodiment) cooperate together to monitor coolant temperature of each MCU (e.g., system coolant temperature), as well as flow of facility coolant through each MCU, and to automatically transition the cooling apparatus between normal-mode, parallel flow of system coolant through the one or more electronic subsystems and the air-to-liquid heat exchanger to failure-mode, serial flow of system coolant from the one or more electronic subsystems to the air-to-liquid heat exchanger, for example, responsive to direct or indirect detection of failure of the chilled facility coolant within the facility coolant loop. Transitioning to failure-mode responsive to detection of a facility coolant failure advantageously establishes serial flow of system coolant from the at least one electronic subsystem to the air-to-liquid heat exchanger, and therefore, the rejecting of heat via the system coolant, from the at least one electronic subsystem to air passing across the air-to-liquid heat exchanger (e.g., egressing from the electronics rack into the data center).

Referring collectively to FIGS. 11A, 11B & 12, MCU control 1 1210 monitors, in one example, temperature of system coolant (T1) egressing from MCU 1 1120, as well as flow of facility coolant via a facility coolant flow meter (F1) disposed, for example, within MCU 1 1120. Similarly, MCU control 2 1220 monitors temperature of system coolant (T2) egressing from MCU 2 1130, as well as flow of facility coolant (F2) within facility coolant loop 1130 passing through MCU 2. Note that, in an alternative implementation, MCU control 1 and MCU control 2 could monitor temperature of facility coolant within the respective facility coolant loop 1122, 1132. In the embodiment of FIG. 12, MCU control 1 and MCU control 2 are coupled to a system controller 1200, which itself is coupled to multiple isolation valves S1, S2 & S3.

As shown in FIG. 11A, isolation valve S1, for example, a solenoid-actuated isolation valve, is disposed in a coolant supply line 1161 coupling in series fluid communication system coolant supply manifold 1140 and air-to-liquid heat exchanger 1160. Isolation valve S2, also by way of example a solenoid-actuated isolation valve, is disposed (in this example) downstream of the system coolant return manifold 1150 so as to be disposed between the plurality of heat-generating electronic subsystems 1110 and a coolant return line 1162, which couples air-to-liquid heat exchanger 1160 to system coolant return manifold 1150. Additionally, a system coolant shunt line 1163 is provided coupling an inlet to air-to-liquid heat exchanger 1160 to between (for example) system coolant return manifold 1150 and isolation valve S2. Coupled in fluid communication with system coolant shunt line 1163 is a third isolation valve S3, which may also comprise a solenoid-actuated isolation valve. The system controller 1200 is coupled to isolation valves S1, S2 & S3 for controlling opening and closing of the isolation valves, for example, with reference to the monitored temperature T1, T2 of system coolant and monitored flow F1, F2 of facility coolant (in one example). In the normal-mode of operation depicted in FIG. 11A, isolation valves S1 and S2 are open, and isolation valve S3 is closed. In this arrangement, system coolant flows in parallel to the electronic subsystems 1110 and the air-to-liquid heat exchanger 1160 for optimal cooling of the electronic components within the electronic subsystems and the air passing through the electronics rack, as described above.

In the failure-mode of operation depicted in FIG. 11B, isolation valves S1 and S2 are closed, and isolation valve S3 is open. The system controller automatically transitions the cooling apparatus from normal-mode, parallel flow of system coolant through the electronic subsystems and the air-to-liquid heat exchanger to failure-mode, serial flow of system coolant from the electronic subsystems to the air-to-liquid heat exchanger responsive to, for example, a failure of the chilled facility coolant from the source. Specifically, in the example described above, should chilled facility coolant cooling or flow be outside design parameters, then monitored system coolant temperature T1 or T2, and/or monitored facility coolant flow F1 or F2, would result in a reading indicative of a failure condition, causing the system controller to transition the cooling system from normal-mode to failure-mode.

Figure 13:
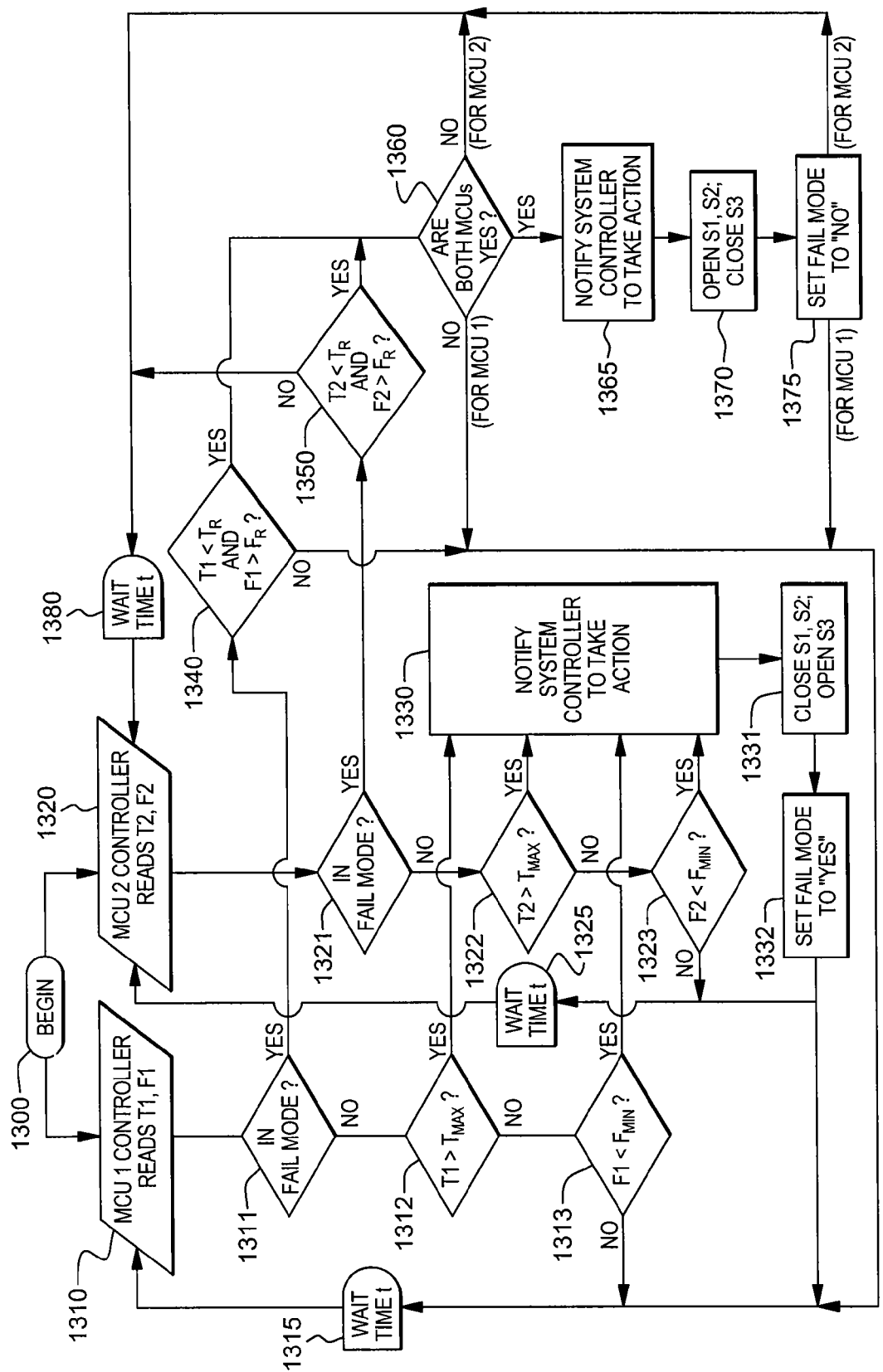
FIG. 13 depicts one embodiment of a process for controlling transitioning of the cooling apparatus of FIGS. 11A & 11B between normal-mode, parallel flow of system coolant through the electronic subsystems and the air-to-liquid heat exchanger, and failure-mode, serial flow of system coolant from the electronic subsystems to the air-to-liquid heat exchanger, in accordance with an aspect of the present invention.

FIG. 13 depicts one embodiment of a process for controlling transitioning of the cooling apparatus of FIGS. 11A, 11B & 12 between normal-mode, parallel flow of system coolant through the electronic subsystems and the air-to-liquid heat exchanger, and failure-mode, serial flow of system coolant from the electronic subsystems to the air-to-liquid heat exchanger, in accordance with an aspect of the present invention. In this example, the sensed parameters are system coolant temperature T1 and T2, and facility coolant flow rates F1 and F2, associated with MCU 1 and MCU 2, described above and depicted in FIGS. 11A-12. By way of example, T1 and F1 are associated with MCU 1, and T2 and F2 are associated with MCU 2, with each MCU controller being tied to the higher-level system controller. It is the higher-level controller, based on information received from the MCU controllers, that will act to position the isolation valves as warranted (i.e., as one example).

The control process of FIG. 13 begins 1300 with the respective MCU 1 and MCU 2 controllers reading T1, F1 & T2, F2 1310, 1320. Before acting on this data, a check is made to determine the mode of operation of the cooling apparatus 1311, 1321. If other than in the failure-mode (i.e., the apparatus is in the normal-mode of operation), then processing compares the sensed parameters against defined set points (or thresholds). Specifically, T1 and T2 are compared against a maximum temperature threshold ($T_{MAX}$) 1312, 1322, and facility coolant flows F1 and F2 (as measured by flow meters F1 & F2, respectively) are compared against a minimum acceptable facility coolant flow ($F_{MIN}$) 1313, 1323. If the temperatures are below $T_{MAX}$ and the flows are above $F_{MIN}$, then the controller cycles back after waiting a time t 1315, 1325 to ascertain a next round of measurements. If either T1 or T2 exceeds $T_{MAX}$, or F1 or F2 falls below $F_{MIN}$, then the respective MCU 1 or MCU 2 controller signals the system controller to take action 1330 with respect to the isolation valves. Responsive to this signal, the system controller closes isolation valve S1 and S2, and opens isolation valve S3 1331, and sets a flag to indicate that the cooling apparatus is now in the failure-mode 1332, after which processing waits time t 1315, 1325 before obtaining a next round of measurements.

If after measurements are taken 1310, 1320, it is determined that the cooling apparatus is in failure-mode of operation (i.e., "fail mode=yes"), then processing determines whether all temperature and flow satisfy a return set of criteria, that is, a set of criteria for returning from failure-mode to normal-mode. The set points $T_R$ and $F_R$ do not necessarily correspond to $T_{MAX}$ and $F_{MIN}$. For example, $T_R$ might be lower in magnitude than $T_{MAX}$, and $F_R$ could be higher in magnitude than $F_{MIN}$. Note that, unlike the transition to the failure-mode of operation where any one parameter could trigger the switch, in order to return back to normal-mode of operation, all parameters must meet the test criteria. Therefore, in failure-mode, processing initially determines whether $T1<T_R$, and $F1>F_R$ 1340, and determines whether $T2<T_R$, and $F2>F_R$ 1350. If inquiry 1340 is "no", processing waits time 1315 before returning to obtain a next set of measurements, while if inquiry 1350 is "no", then processing waits a time t 1380 before returning to collect a next set of measurements 1320. Note that inquiry 1340 might result in a "yes", and inquiry 1350 might result in a "no" or vice versa. In order to proceed, both inquiries must be "yes" 1360. Thus, for a "yes" inquiry 1340, 1350, where the other inquiry is "no", processing returns from 1360 to wait time t 1315 or wait time t 1380, depending upon whether the "yes" from the inquiry was for MCU 1 or MCU 2. Assuming that all tests are met for both MCUs 1360, then the system controller is notified to take action 1365 to open isolation valves S1 and S2, and close isolation valve S3 1370, after which the failure-mode flag is set back to "no", indicating normal-mode of operation 1375, and the process loop continues.

Those skilled in the art should note from the above description that the control process of FIG. 13, as well as the cooling apparatus of FIGS. 11A-12, can be readily modified to employ a single MCU, or alternatively, more than two MCUs, if desired.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable signal medium may include a propagated data signal with computer readable program code embodied therein, for example, in baseband or as part of a carrier wave. Such a propagated signal may take any of a variety of forms, including, but not limited to, electromagnetic, optical or any suitable combination thereof. A computer readable signal medium may be any computer readable medium that is not a computer readable storage medium and that can communicate, propagate, or transport a program for use by or in connection with an instruction execution system, apparatus or device.

A computer readable storage medium may be, for example, but not limited to, an electronic, magnetic, optical, electromagnetic, infrared or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Figure 14:
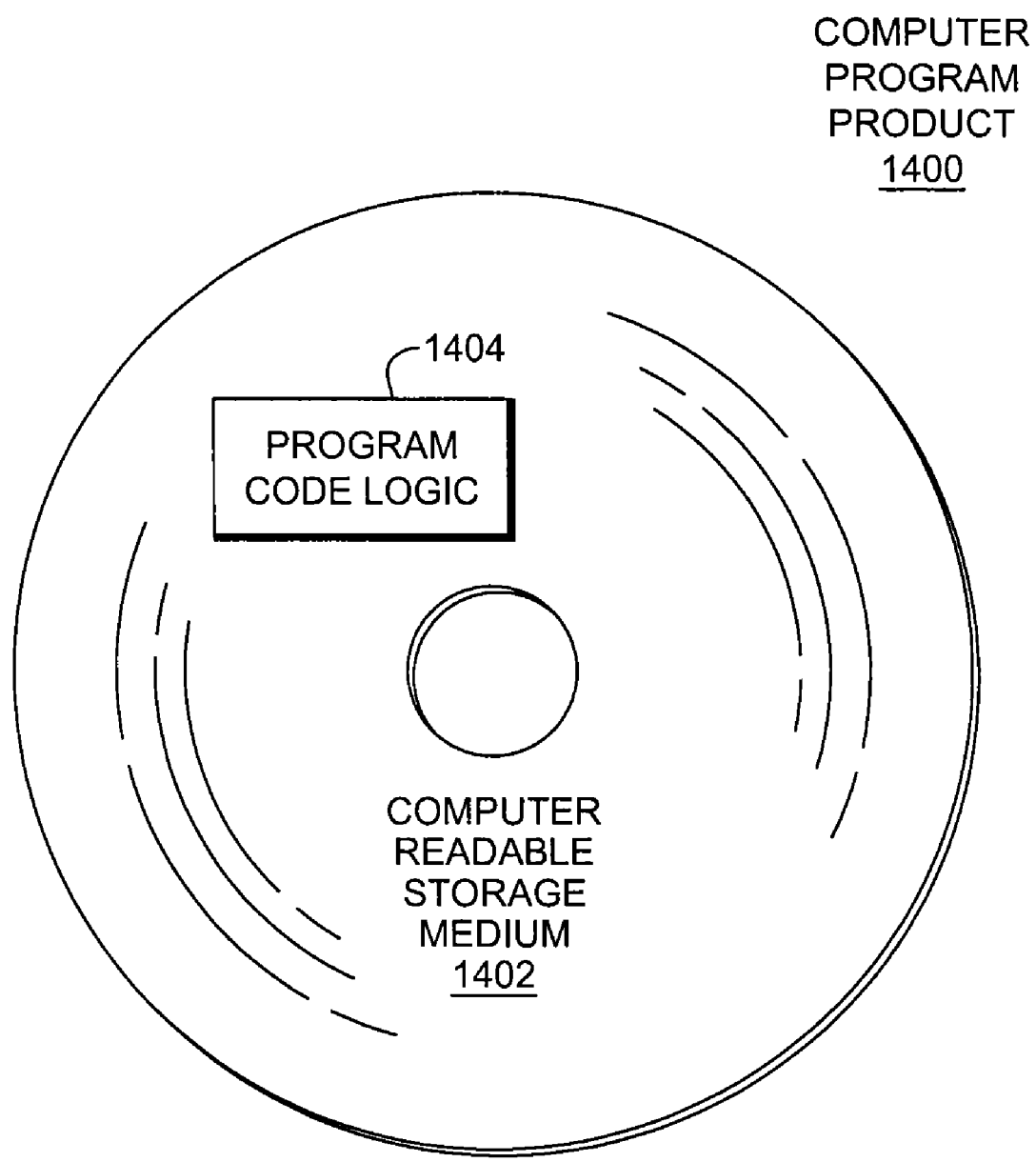
FIG. 14 depicts one embodiment of a computer program product incorporating one or more aspects of the present invention.

Referring now to FIG. 14, in one example, a computer program product 1400 includes, for instance, one or more computer readable storage media 1402 to store computer readable program code means or logic 1404 thereon to provide and facilitate one or more aspects of the present invention.

Program code embodied on a computer readable medium may be transmitted using an appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language, such as Java, Smalltalk, C++ or the like, and conventional procedural programming languages, such as the "C" programming language, assembler or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In addition to the above, one or more aspects of the present invention may be provided, offered, deployed, managed, serviced, etc. by a service provider who offers management of customer environments. For instance, the service provider can create, maintain, support, etc. computer code and/or a computer infrastructure that performs one or more aspects of the present invention for one or more customers. In return, the service provider may receive payment from the customer under a subscription and/or fee agreement, as examples. Additionally or alternatively, the service provider may receive payment from the sale of advertising content to one or more third parties.

In one aspect of the present invention, an application may be deployed for performing one or more aspects of the present invention. As one example, the deploying of an application comprises providing computer infrastructure operable to perform one or more aspects of the present invention.

As a further aspect of the present invention, a computing infrastructure may be deployed comprising integrating computer readable code into a computing system, in which the code in combination with the computing system is capable of performing one or more aspects of the present invention.

As yet a further aspect of the present invention, a process for integrating computing infrastructure comprising integrating computer readable code into a computer system may be provided. The computer system comprises a computer readable medium, in which the computer medium comprises one or more aspects of the present invention. The code in combination with the computer system is capable of performing one or more aspects of the present invention.

Although various embodiments are described above, these are only examples. For example, computing environments of other architectures can incorporate and use one or more aspects of the present invention. Additionally, the network of nodes can include additional nodes, and the nodes can be the same or different from those described herein. Also, many types of communications interfaces may be used. Further, other types of programs and/or other optimization programs may benefit from one or more aspects of the present invention, and other resource assignment tasks may be represented. Resource assignment tasks include the assignment of physical resources. Moreover, although in one example, the partitioning minimizes communication costs and convergence time, in other embodiments, the cost and/or convergence time may be otherwise reduced, lessened, or decreased.

Further, other types of computing environments can benefit from one or more aspects of the present invention. As an example, an environment may include an emulator (e.g., software or other emulation mechanisms), in which a particular architecture (including, for instance, instruction execution, architected functions, such as address translation, and architected registers) or a subset thereof is emulated (e.g., on a native computer system having a processor and memory). In such an environment, one or more emulation functions of the emulator can implement one or more aspects of the present invention, even though a computer executing the emulator may have a different architecture than the capabilities being emulated. As one example, in emulation mode, the specific instruction or operation being emulated is decoded, and an appropriate emulation function is built to implement the individual instruction or operation.

In an emulation environment, a host computer includes, for instance, a memory to store instructions and data; an instruction fetch unit to fetch instructions from memory and to optionally, provide local buffering for the fetched instruction; an instruction decode unit to receive the fetched instructions and to determine the type of instructions that have been fetched; and an instruction execution unit to execute the instructions. Execution may include loading data into a register from memory; storing data back to memory from a register; or performing some type of arithmetic or logical operation, as determined by the decode unit. In one example, each unit is implemented in software. For instance, the operations being performed by the units are implemented as one or more subroutines within emulator software.

Further, a data processing system suitable for storing and/or executing program code is usable that includes at least one processor coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiment with various modifications as are suited to the particular use contemplated.

What is claimed is:

1. A cooling apparatus for facilitating cooling of an electronics rack comprising at least one electronic subsystem, the cooling apparatus comprising:

at least one cooling unit configured to provide, via a coolant loop, system coolant to the at least one electronic subsystem for facilitating cooling thereof, wherein each cooling unit comprises a liquid-to-liquid heat exchanger, a first coolant path and a second coolant path, the first coolant path of each cooling unit receiving, in normal operation, chilled coolant from a source and passing at least a portion thereof through the liquid-to-liquid heat exchanger, and the second coolant path being coupled in fluid communication with the coolant loop, and in normal operation, providing cooled system coolant to the at least one electronic subsystem, and expelling heat in the liquid-to-liquid heat exchanger from the system coolant to the chilled coolant in the first coolant path;

an air-to-liquid heat exchanger associated with the electronics rack for cooling, in normal operation, at least a portion of air passing through the electronics rack, the air-to-liquid heat exchanger being coupled to the coolant loop to receive system coolant therefrom and exhaust system coolant thereto;

multiple isolation valves coupled to the coolant loop to facilitate transitioning of the cooling apparatus between a normal-mode, parallel flow of system coolant through the at least one electronic subsystem and the air-to-liquid heat exchanger and a failure-mode, serial flow of system coolant from the at least one electronic subsystem to the air-to-liquid heat exchanger; and at least one controller coupled to the multiple isolation valves for automatically transitioning the cooling apparatus from the normal-mode, parallel flow of system coolant through the at least one electronic subsystem and the air-to-liquid heat exchanger to the failure-mode, serial flow of system coolant from the at least one electronic subsystem to the air-to-liquid heat exchanger responsive to a failure of the chilled coolant from the source, wherein in normal-mode, the at least one cooling unit provides cooled system coolant in parallel to the at least one electronic subsystem, for liquid-cooling thereof, and to the air-to-liquid heat exchanger for cooling at least a portion of air passing through the electronics rack, and responsive to detection of the failure, the at least one controller employs the multiple isolation valves to automatically transition the cooling apparatus to the failure-mode, serial flow of system coolant from the at least one electronic subsystem to the air-to-liquid heat exchanger for rejecting, via the system coolant, heat from the at least one electronic subsystem to air passing across the air-to-liquid heat exchanger.

2. The cooling apparatus of claim 1, wherein the coolant loop comprises a system coolant supply manifold and a system coolant return manifold associated with the electronics rack, the system coolant supply manifold and system coolant return manifold each being coupled in fluid communication with the at least one cooling unit for facilitating providing system coolant to the at least one electronic subsystem and the air-to-liquid heat exchanger, and wherein the air-to-liquid heat exchanger is coupled via a coolant supply line to the system coolant supply manifold for receiving system coolant from the system coolant supply manifold and is coupled via a coolant return line to the system coolant return manifold for exhausting system coolant to the system coolant return manifold, and wherein in normal-mode, the at least one cooling unit provides cooled system coolant to the system coolant supply manifold and receives exhausted system coolant from the system coolant return manifold, the system coolant supply manifold supplying cooled system coolant in parallel to the at least one electronic subsystem and the air-to-liquid heat exchanger.

3. The cooling apparatus of claim 2, wherein the at least one electronic subsystem is coupled in fluid communication between the system coolant supply manifold and the system coolant return manifold, and wherein the multiple isolation valves comprise a first isolation valve associated with the coolant supply line supplying system coolant to the air-to-liquid heat exchanger and a second isolation valve associated with the system coolant return manifold and disposed in fluid communication therewith downstream of the at least one electronic subsystem and upstream of the coolant return line coupling the air-to-liquid heat exchanger to the system coolant return manifold.

4. The cooling apparatus of claim 3, further comprising a system coolant shunt line with a first end coupled in fluid communication with the system coolant return manifold downstream of the at least one electronic subsystem and upstream of the second isolation valve, and a second end coupled in fluid communication with the coolant supply line between the first isolation valve and an inlet to the air-to-liquid heat exchanger, wherein in normal-mode, the first isolation valve and the second isolation valve are open, and the third isolation valve is closed so that system coolant flows in parallel through the at least one electronic subsystem and the air-to-liquid heat exchanger, and responsive to detection of the failure, the at least one controller closes the first isolation valve and the second isolation valve, and opens the third isolation valve to transition the cooling apparatus to failure-mode, serial flow of system coolant from the at least one electronic subsystem to the air-to-liquid heat exchanger for rejecting, via the system coolant, heat from the at least one electronic subsystem to air passing across the air-to-liquid heat exchanger.

5. The cooling apparatus of claim 1, wherein the cooling apparatus further comprises a temperature sensor for monitoring a coolant temperature associated with the at least one cooling unit, the at least one controller being coupled to the temperature sensor, and responding to the coolant temperature exceeding a defined threshold by transitioning the cooling apparatus from the normal-mode, parallel flow of system coolant through the at least one electronic subsystem and the air-to-liquid heat exchanger to the failure-mode, serial flow of system coolant from the at least one electronic subsystem to the air-to-liquid heat exchanger.

6. The cooling apparatus of claim 5, wherein the temperature sensor is disposed to monitor temperature of system coolant output by the at least one cooling unit, and the at least one controller responds to system coolant temperature exceeding the defined threshold by transitioning the cooling apparatus from the normal-mode, parallel flow of system coolant through the at least one electronic subsystem and the air-to-liquid heat exchanger to the failure-mode, serial flow of system coolant from the at least one electronic subsystem to the air-to-liquid heat exchanger.

7. The cooling apparatus of claim 1, wherein the cooling apparatus further comprises a flow monitor for monitoring chilled coolant flow from the source to the at least one cooling unit, the at least one controller responding to a chilled coolant flow below a defined flow threshold by transitioning the cooling apparatus from the normal-mode, parallel flow of system coolant through the at least one electronic subsystem and the air-to-liquid heat exchanger to the failure-mode, serial flow of system coolant from the at least one electronic subsystem to the air-to-liquid heat exchanger.

8. The cooling apparatus of claim 1, further comprising the at least one controller automatically transitioning the cooling apparatus from the failure-mode, serial flow of system coolant from the at least one electronic subsystem to the air-to-liquid heat exchanger to the normal-mode, parallel flow of system coolant through the at least one electronic subsystem and the air-to-liquid heat exchanger responsive to correction of the failure of the chilled coolant from the source, wherein the at least one controller monitors at least one of a coolant temperature associated with the at least one cooling unit or chilled coolant flow from the source to the at least one cooling unit.

9. The cooling apparatus of claim 1, wherein the air-to-liquid heat exchanger is disposed at an air outlet side of the electronics rack for cooling air egressing from the electronics rack in the normal mode and for exhausting heat from the at least one electronic subsystem to air egressing from the electronics rack in the failure mode.

10. A cooled electronic system comprising:
   an electronics rack comprising an air inlet side and an air outlet side for respectively enabling ingress and egress of air through the electronics rack, the electronics rack further comprising at least one electronic subsystem; and
   a cooling apparatus for facilitating cooling of the electronics rack, the cooling apparatus comprising:
      at least one cooling unit configured to provide, via a coolant loop, system coolant to the at least one electronic subsystem for facilitating cooling thereof, wherein each cooling unit comprises a liquid-to-liquid heat exchanger, a first coolant path and a second coolant path, the first coolant path of each cooling unit receiving, in normal operation, chilled coolant from a source and passing at least a portion thereof through the liquid-to-liquid heat exchanger, and the second coolant path being coupled in fluid communication with the coolant loop, and in normal operation, providing cooled system coolant to the at least one electronic subsystem, and expelling heat in the liquid-to-liquid heat exchanger from the system coolant to the chilled coolant in the first coolant path;
      an air-to-liquid heat exchanger associated with the electronics rack for cooling, in normal operation, at least a portion of air passing through the electronics rack, the air-to-liquid heat exchanger being coupled to the coolant loop to receive system coolant therefrom and exhaust system coolant thereto;
      multiple isolation valves coupled to the coolant loop to facilitate transitioning of the cooling apparatus between a normal-mode, parallel flow of system coolant through the at least one electronic subsystem and the air-to-liquid heat exchanger and a failure-mode, serial flow of system coolant from the at least one electronic subsystem to the air-to-liquid heat exchanger; and at least one controller coupled to the multiple isolation valves for automatically transitioning the cooling apparatus from the normal-mode, parallel flow of system coolant through the at least one electronic subsystem and the air-to-liquid heat exchanger to the failure-mode, serial flow of system coolant from the at least one electronic subsystem to the air-to-liquid heat exchanger responsive to a failure of the chilled coolant from the source, wherein in normal-mode, the at least one cooling unit provides cooled system coolant in parallel to the at least one electronic subsystem, for liquid-cooling thereof, and to the air-to-liquid heat exchanger for cooling at least a portion of air passing through the electronics rack, and responsive to detection of the failure, the at least one controller employs the multiple isolation valves to automatically transition the cooling apparatus to the failure-mode, serial flow of system coolant from the at least one electronic subsystem to the air-to-liquid heat exchanger for rejecting, via the system coolant, heat from the at least one electronic subsystem to air passing across the air-to-liquid heat exchanger.

11. The cooled electronic system of claim 10, wherein the multiple isolation valves comprise a first isolation valve associated with a coolant supply line supplying system coolant to the air-to-liquid heat exchanger and a second isolation valve associated with the coolant loop downstream of the at least one electronic subsystem and upstream of a coolant return line coupling in fluid communication the air-to-liquid heat exchanger and the coolant loop.

12. The cooled electronic system of claim 11, further comprising a system coolant shunt line with a first end coupled in fluid communication with the coolant loop downstream of the at least one electronic subsystem and upstream of the second isolation valve, and a second end coupled in fluid communication with the coolant supply line between the first isolation valve and an inlet to the air-to-liquid heat exchanger, wherein in normal-mode, the first isolation valve and the second isolation valve are open, and the third isolation valve is closed so that system coolant flows in parallel through the at least one electronic subsystem and the air-to-liquid heat exchanger, and responsive to detection of a failure, the at least one controller closes the first isolation valve and the second isolation valve, and opens the third isolation valve to transition the cooling apparatus to failure-mode, serial flow of system coolant from the at least one electronic subsystem to the air-to-liquid heat exchanger for rejecting, via the system coolant, heat from the at least one electronic subsystem to air passing across the air-to-liquid heat exchanger.

13. The cooled electronic system of claim 10, wherein the cooling apparatus further comprises a temperature sensor for monitoring a coolant temperature associated with the at least one cooling unit, the at least one controller being coupled to the temperature sensor, and responding to the coolant temperature exceeding a defined threshold by transitioning the cooling apparatus from the normal-mode, parallel flow of system coolant through the at least one electronic subsystem and the air-to-liquid heat exchanger to the failure-mode, serial flow of system coolant from the at least one electronic subsystem to the air-to-liquid heat exchanger.

14. The cooled electronic system of claim 10, wherein the cooling apparatus further comprises a flow monitor for monitoring chilled coolant flow from the source to the at least one cooling unit, the at least one controller responding to a chilled coolant flow below a defined flow threshold by transitioning the cooling apparatus from the normal-mode, parallel flow of system coolant through the at least one electronic subsystem and the air-to-liquid heat exchanger to the failure-mode, serial flow of system coolant from the at least one electronic subsystem to the air-to-liquid heat exchanger.

15. The cooled electronic system of claim 10, further comprising the at least one controller automatically transitioning the cooling apparatus from the failure-mode, serial flow of system coolant from the at least one electronic subsystem to the air-to-liquid heat exchanger to the normal-mode, parallel flow of system coolant through the at least one electronic subsystem and the air-to-liquid heat exchanger responsive to correction of the failure of the chilled coolant from the source, wherein the at least one controller monitors at least one of a coolant temperature associated with the at least one cooling unit or chilled coolant flow from the source to the at least one cooling unit.

16. A method of facilitating cooling of an electronics rack, the method comprising:

employing at least one cooling unit configured to provide, via a coolant loop, system coolant to at least one electronic subsystem of the electronics rack for facilitating cooling thereof, wherein each cooling unit comprises a liquid-to-liquid heat exchanger, a first coolant path and a second coolant path, the first coolant path of each cooling unit receiving, in normal operation, chilled coolant from a source and passing at least a portion thereof through the liquid-to-liquid heat exchanger, and the second coolant path being coupled in fluid communication with the coolant loop, and providing in normal operation, cooled system coolant to the at least one electronic subsystem, and expelling heat in the liquid-to-liquid heat exchanger from the system coolant to the chilled coolant in the first coolant path;

utilizing an air-to-liquid heat exchanger associated with the electronics rack for cooling, in normal operation, at least a portion of air passing through the electronics rack, the air-to-liquid heat exchanger being coupled to the coolant loop to receive system coolant therefrom and exhaust system coolant thereto; and employing multiple isolation valves coupled to the coolant loop to facilitate automatic transitioning of the cooling apparatus by at least one controller thereof, from normal-mode, parallel flow of system coolant through the at least one electronic subsystem and the air-to-liquid heat exchanger to failure-mode, serial flow of system coolant from the at least one electronic subsystem to the air-to-liquid heat exchanger responsive to a failure of the chilled coolant from the source, wherein in normal-mode, the at least one cooling unit provides cooled system coolant in parallel to the at least one electronic subsystem, for liquid-cooling thereof, and the air-to-liquid heat exchanger for cooling at least a portion of air passing through the electronics rack, and responsive to detection of the failure, the at least one controller employs the multiple isolation valves to automatically transition the cooling apparatus to the failure-mode, serial flow of system coolant from the at least one electronic subsystem to the air-to-liquid heat exchanger for rejecting, via the system coolant, heat from the at least one electronic subsystem to air passing across the air-to-liquid heat exchanger.

17. The method of claim 16, wherein the multiple isolation valves comprise a first isolation valve associated with a coolant supply line supplying system coolant to the air-to-liquid heat exchanger and a second isolation valve associated with the coolant loop downstream of the at least one electronic subsystem and upstream of a coolant return line coupling in fluid communication the air-to-liquid heat exchanger and the coolant loop.

18. The method of claim 16, further comprising monitoring a coolant temperature associated with the at least one cooling unit, the at least one controller responding to the coolant temperature exceeding a defined threshold by transitioning the cooling apparatus from the normal-mode, parallel flow of system coolant through the at least one electronic subsystem and the air-to-liquid heat exchanger to the failure-mode, serial flow of system coolant from the at least one electronic subsystem to the air-to-liquid heat exchanger.

19. The method of claim 16, further comprising monitoring flow of chilled coolant from the source to the at least one cooling unit, and responding to chilled coolant flow below a defined flow threshold, transitioning by the at least one controller the cooling apparatus from the normal-mode, parallel flow of system coolant through the at least one electronic subsystem and the air-to-liquid heat exchanger to the failure-mode, serial flow of system coolant from the at least one electronic subsystem to the air-to-liquid heat exchanger.

20. The method of claim 16, further comprising automatically transitioning, by the at least one controller, the cooling apparatus from the failure-mode, serial flow of system coolant from the at least one electronic subsystem to the air-to-liquid heat exchanger to the normal-mode, parallel flow of system coolant through the at least one electronic subsystem and the air-to-liquid heat exchanger responsive to correction of the failure of the chilled coolant from the source, wherein the at least one controller monitors at least one of a coolant temperature associated with the at least one cooling unit or chilled coolant flow from the source to the at least one cooling unit.

* * * * *